United States Patent
Sato et al.

(10) Patent No.: US 7,468,112 B2
(45) Date of Patent: Dec. 23, 2008

(54) METHOD OF PRODUCING A CERAMIC LAMINATE

(75) Inventors: Kazuhide Sato, Aichi-pref. (JP); Hidekazu Hattori, Nagoya (JP); Ikuo Ito, Anjyo (JP); Syouichi Takenouchi, Toyota (JP); Toshiaki Kamiya, Yokkaichi (JP)

(73) Assignee: Denso Corporation (JP)

( * ) Notice: Subject to any disclaimer, the term of this patent is extended or adjusted under 35 U.S.C. 154(b) by 0 days.

(21) Appl. No.: 10/123,206

(22) Filed: Apr. 17, 2002

(65) Prior Publication Data

US 2002/0152857 A1    Oct. 24, 2002

(30) Foreign Application Priority Data

| Apr. 18, 2001 | (JP) | ............................ 2001-119997 |
| Apr. 27, 2001 | (JP) | ............................ 2001-133130 |
| Feb. 25, 2002 | (JP) | ............................ 2002-048230 |

(51) Int. Cl.
*B32B 37/02* (2006.01)
*B32B 38/04* (2006.01)
*C04B 33/32* (2006.01)
*H01L 41/083* (2006.01)

(52) U.S. Cl. .................. 156/89.11; 156/89.12
(58) Field of Classification Search ................. 156/182, 156/89.11, 89.12, 89.14, 89.16, 154, 261, 156/264; 361/321.2, 321.3; 29/851
See application file for complete search history.

(56) References Cited

U.S. PATENT DOCUMENTS

| 3,192,086 | A | * | 6/1965 | Gyurk ...................... 156/89.14 |
| 3,235,939 | A | * | 2/1966 | Rodriguez et al. ......... 29/25.42 |
| 3,546,776 | A | * | 12/1970 | Rodriguez et al. ............ 29/851 |
| RE27,116 | E | * | 4/1971 | Miller et al. ................. 310/359 |
| 4,347,650 | A | * | 9/1982 | Mc Larney et al. ........ 29/25.42 |
| 5,057,360 | A | * | 10/1991 | Osaka et al. ................. 428/220 |
| 5,169,310 | A | * | 12/1992 | Chance et al. .............. 432/258 |
| 5,300,852 | A | | 4/1994 | Isogai et al. |
| 5,368,667 | A | * | 11/1994 | Minh et al. ............... 156/89.14 |
| 5,534,092 | A | * | 7/1996 | Ogawa et al. ............ 156/89.16 |
| 6,260,248 | B1 | * | 7/2001 | Cramer et al. ............. 29/25.35 |
| 6,873,089 | B2 | * | 3/2005 | Kobayashi et al. .......... 310/328 |
| 6,978,525 | B2 | * | 12/2005 | Iwase et al. ................. 29/25.35 |
| 2002/0149297 | A1 | | 10/2002 | Yamamoto et al. |
| 2002/0152857 | A1 | | 10/2002 | Sato et al. |

(Continued)

FOREIGN PATENT DOCUMENTS

JP    61-142615    6/1986

(Continued)

OTHER PUBLICATIONS

Official Action issued Jan. 30, 2006 in counterpart Japanese Application 2002-048230.

(Continued)

*Primary Examiner*—Melvin C Mayes
(74) *Attorney, Agent, or Firm*—Nixon & Vanderhye PC

(57) ABSTRACT

A high reliability ceramic laminate suppresses delamination and cracks. Wide ceramic sheets are temporarily laminated by heat and pressure to form a pre-laminate which is cut to form a unit body. Unit bodies are laminated to obtain a ceramic laminate. Dewaxing removes not less than 90% of a binder resin before the ceramic laminate is sintered.

17 Claims, 27 Drawing Sheets

U.S. PATENT DOCUMENTS

| | | | |
|---|---|---|---|
| 2002/0157756 A1* | 10/2002 | Sato et al. | 156/50 |
| 2002/0175591 A1* | 11/2002 | Schreiner et al. | 310/311 |
| 2003/0070271 A1* | 4/2003 | Yasugi et al. | 29/25.35 |
| 2003/0161993 A1* | 8/2003 | Biesinger et al. | 428/132 |

FOREIGN PATENT DOCUMENTS

| | | | |
|---|---|---|---|
| JP | 62-52980 | * | 3/1987 |
| JP | 63-176147 | * | 7/1988 |
| JP | 1-235633 | * | 9/1989 |
| JP | 1-269532 | | 10/1989 |
| JP | 2-28977 | | 1/1990 |
| JP | 03-173107 | | 7/1991 |
| JP | 04-091664 | * | 3/1992 |
| JP | 04-305997 | | 10/1992 |
| JP | 04-333294 | | 11/1992 |
| JP | 4-333294 | | 11/1992 |
| JP | 5-7029 | | 1/1993 |
| JP | 05-124871 | | 5/1993 |
| JP | 5-299288 | * | 11/1993 |
| JP | 06-116007 | | 4/1994 |
| JP | 6-151999 | | 5/1994 |
| JP | A-7-78724 | | 3/1995 |
| JP | 07-097275 | | 4/1995 |
| JP | 7-122457 | * | 5/1995 |
| JP | 07-122457 | | 5/1995 |
| JP | 07-240337 | | 9/1995 |
| JP | 08-069942 | | 3/1996 |
| JP | 8-162364 | | 6/1996 |
| JP | A-8-162364 | | 6/1996 |
| JP | 10-92686 | * | 4/1998 |
| JP | A-10-149961 | | 6/1998 |
| JP | 11-207693 | | 8/1999 |
| JP | 2000-500925 | | 1/2000 |
| JP | 2000-277919 | | 10/2000 |
| JP | 2000-332312 | * | 11/2000 |
| JP | 2002-1696 | | 1/2002 |
| JP | 2002-314156 | | 10/2002 |
| JP | 2002-314161 | | 10/2002 |
| WO | 01/17038 | * | 3/2001 |

OTHER PUBLICATIONS

Submission of Publications filed Jun. 16, 2006 by a third party in counterpart Japanese Application 2002-048230.

Japanese Official Action issued Aug. 9, 2006 and mailed Aug. 22, 2006 in counterpart Japanese Application 2002-048230 with English translation.

* cited by examiner

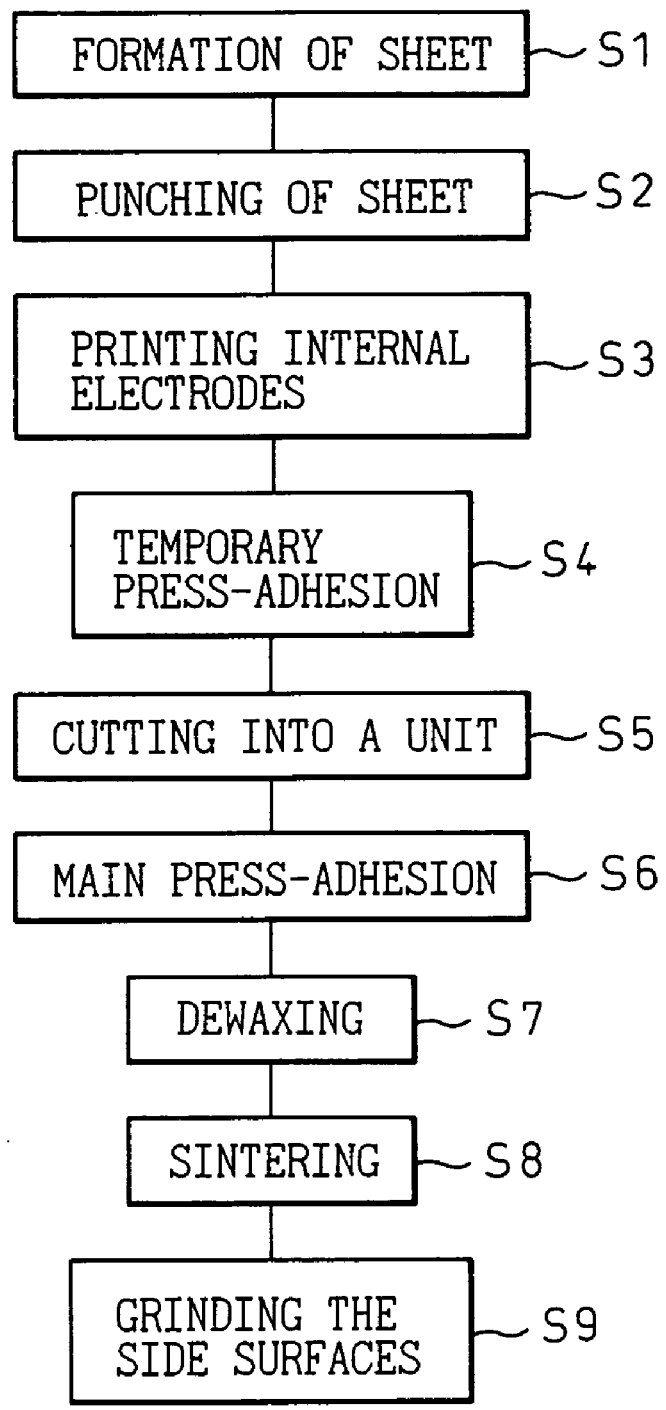

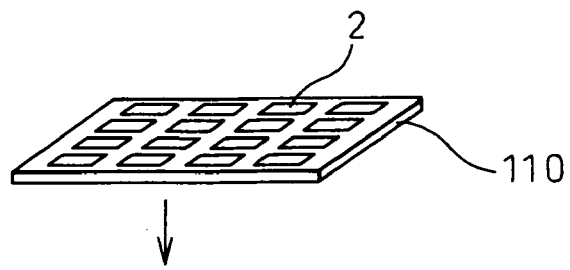
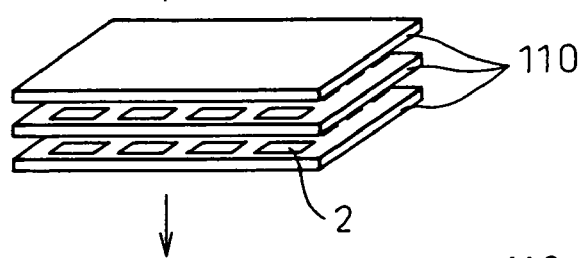
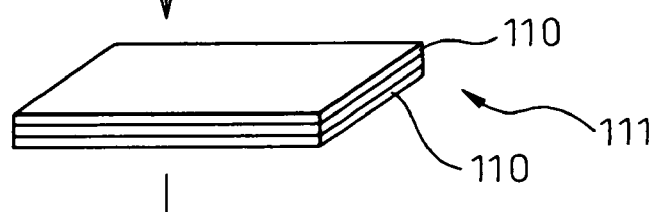
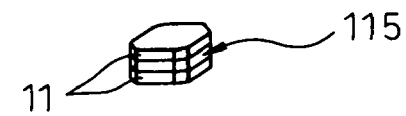
Fig.29(a)
Fig.29(b)
Fig.29(c)
Fig.29(d)
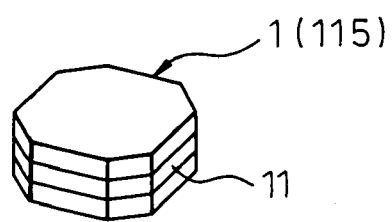
Fig.30

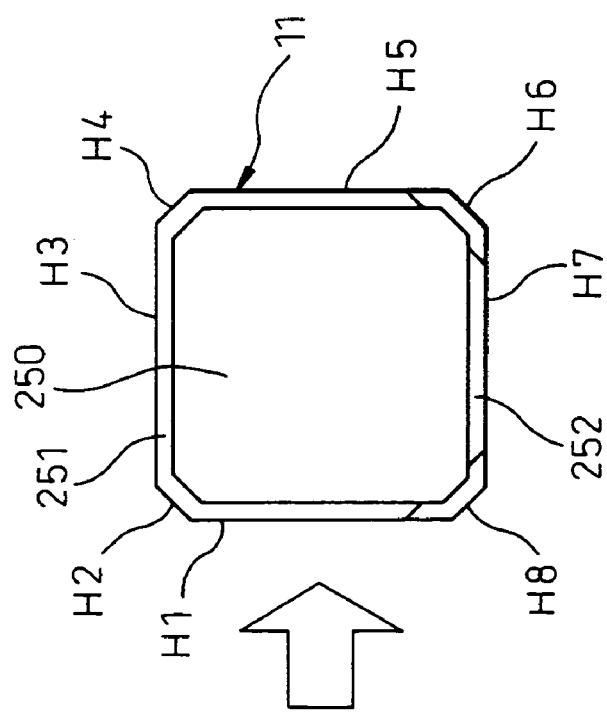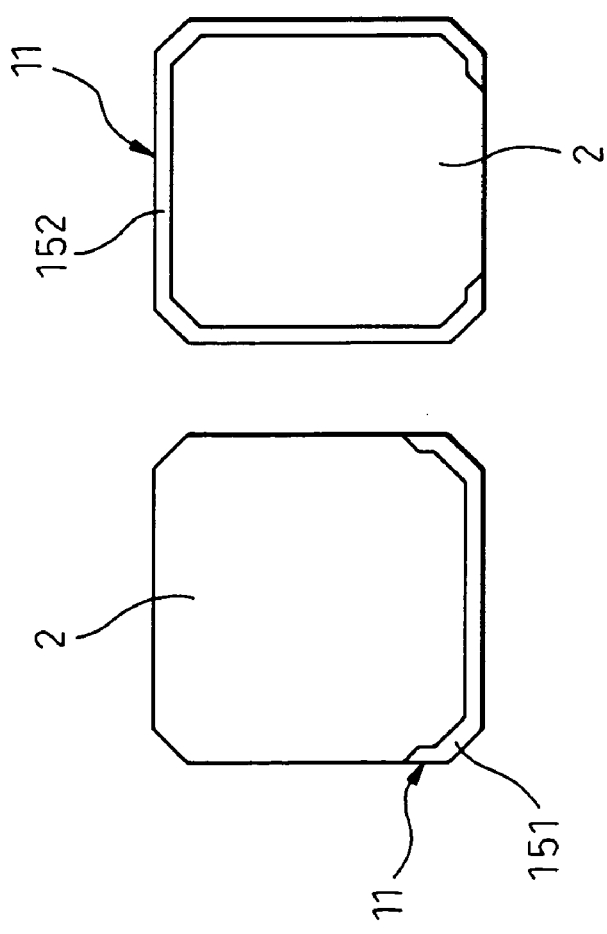

METHOD OF PRODUCING A CERAMIC LAMINATE

BACKGROUND OF THE INVENTION

1. Field of the Invention

The present invention relates to a method of producing a ceramic laminate by laminating a plurality of ceramic layers.

2. Description of the Related Art

A ceramic laminate is often used as a high-performance component of, for example, a piezo-electric actuator. The piezo-electric actuator employs a ceramic laminate that is constituted by alternately laminating ceramic layers and internal electrode layers. In recent years, for instance, the piezo-electric actuator has been built up with an increased number of ceramic layers each of which having a small thickness to obtain a large displacement with a low voltage. For example, the piezo-electric actuator has a structure of a laminate of, generally, 50 to 700 layers by alternately laminating thin piezo-electric ceramic layers each having a thickness of usually 20 to 200 μm and metallic electrodes (internal electrodes), yet suppressing the overall size thereof for easy incorporation in an apparatus.

As a method of producing the above-mentioned laminate, International Patent Publication No. 2000-500925 teaches an art comprising cutting or punching first laminates obtained by laminating and temporarily adhering the sheets, dewaxing the first laminates and, then, stacking the laminates followed by sintering.

However, a decrease in the thickness of the ceramic layers and an increase in the number of the layers bring about such problems as delamination (peeling among the layers) and the occurrence of cracks in the ceramic laminate. The delamination and the cracks can cause a malfunction of the ceramic laminate.

The above-mentioned International Patent Publication No. 2000-500925 proposes forming first laminates of green sheets having a large area and a thickness of up to 3 mm, dewaxing the first laminates, and stacking them to form a second laminate of a total height of not smaller than 5 mm. This method decreases irregularity in the stress at the time of adhesion with pressure. However, the first laminates after dewaxed are very brittle and are likely to be damaged even by a small stress when they are taken out from the dewaxing furnace, conveyed and stacked. The delamination and cracks occur at the damaged portions in the subsequent final products.

As it is not limited to the case of piezo-electric actuators, this kind of problem could similarly occur in any other ceramic laminate.

A working example of the above publication further discloses one that is cut into a square shape. When punched into a square shape, however, the internal electrodes are extremely deformed at the corners, and the distance becomes nonuniform among the internal electrodes.

The cause of this deformation is attributed to the punching stress in the first laminate not being uniform because the first laminate being punched is thick and the viscosity is not the same between the internal electrodes and the piezo-electric sheets.

This deformation develops delamination (peeling of the layers) during the dewaxing and sintering, resulting in a change in the characteristics of the product because a uniform voltage is not applied. Therefore, the deformed portions must be cut off in some step after the punching, such as after the sintering. Many steps are required for cutting off the deformed portions, and the material that is cut off is wasted.

The deformation has a correlation to the warping of the work, and it is considered that the deformation could be decreased if the warping could be decreased.

On the other hand, Japanese Unexamined Patent Publication (Kokai) No. 162364/1996 teaches an art of cutting a sheet, laminating a plurality of pieces of the sheets thus cut to form a first laminate, laminating and adhering another plurality of sheets on the first laminate with the application of pressure, and repeating the above-mentioned procedure a plural number of times until a finally desired number of pieces of sheets are laminated.

According to the method of the above publication, however, the sheet is cut into a small size. Therefor each piece of sheet must be handled while being conveyed and laminated, requiring a greatly extended period of time and deteriorating the production efficiency.

SUMMARY OF THE INVENTION

The present invention was accomplished in view of the above-mentioned problems inherent in the prior art, and its object is to provide a method of producing a ceramic laminate capable of suppressing the occurrence of delamination and cracks, and features improved reliability (problem A). The invention further provides a method of producing a ceramic laminate having many layers without deteriorating the production efficiency, suppressing the deformation of the internal electrode layers and maintaining improved reliability (problem B).

The following first to third aspects of the invention are intended to solve the above-mentioned problem A.

According to the first aspect of the present invention, there is provided a method of producing a ceramic laminate by laminating a plurality of pieces of ceramic layers, comprising:

a temporarily press-adhering step of laminating wide ceramic sheets including a plurality of ceramic layers in the direction of width in a number of pieces smaller than a final number of the laminated layers, followed by heating and pressing in the direction of lamination to form a pre-laminate;

a unit-cutting step of forming a unit body having a width that includes a piece of a ceramic layer in the direction of width and having a number of layers smaller than the final number of the laminated layers by cutting the pre-laminate into a plurality of pieces in the direction of width;

a main press-adhering step of laminating a plurality of the unit bodies so that the ceramic layers are laminated in the final number of the laminated layers, and heating and pressing the unit bodies in the direction of lamination to obtain the ceramic laminate;

a dewaxing step of heating and removing not less than 90% of a binder resin contained in the ceramic layers of the ceramic laminate after the main press-adhering step has been finished; and a sintering step of sintering the ceramic laminate.

In the present invention, the main press-adhering step is conducted after the temporarily press-adhering step and after the unit-cutting step, and, thereafter, the dewaxing step and the sintering step are conducted.

In the temporarily press-adhering step, the above-mentioned wide ceramic sheets are laminated and temporarily adhered with pressure. Here, as the ceramic sheets have a large width, the pressure can be nearly uniformly exerted at the time of press-adhering. Therefore, the temporarily press-adhering step suppresses the occurrence of damage caused by a deviation in the pressure.

Next, the unit-cutting step obtains the unit body which is cut into a width that contains a piece of ceramic layer having a basic area of the ceramic laminate that is to be obtained. In the main press-adhering step, the unit bodies are laminated, heated and press-adhered to obtain a ceramic laminate having the final number of the laminated layers. In the thermal press-adhesion in this case, the unit bodies are laminated and pressurized; i.e., the pressure is stably exerted as compared to when the individual pieces are not laminated and thermally press-adhered in the form of unit bodies. Therefore, occurrence of damage is suppressed in the main press-adhering step. Besides, the unit bodies have not yet been put to the dewaxing step, and still maintain the flexibility of the ceramic layers; i.e., the unit bodies are not brittle and are not broken.

After the main press-adhering step of forming the ceramic laminate having the final number of the laminated layers, the ceramic laminate is put to the dewaxing step. Therefore, the remaining step that handles the ceramic laminate that becomes brittle after having been put through the dewaxing step, is the sintering step only, and the ceramic laminate is not likely to be damaged.

Upon conducting the temporarily press-adhering step, unit-cutting step, main press-adhering step, dewaxing step and sintering step in this order, as described above, there is established a method of production capable of suppressing the occurrence of damage. Thus, there is provided a method of producing a ceramic laminate which suppresses the occurrence of delamination and cracks, and features improved reliability.

According to the second aspect of the invention, there is provided a method of producing a ceramic laminate by laminating a plurality of pieces of ceramic layers, comprising:

a first temporarily press-adhering step of laminating wide ceramic sheets including a plurality of ceramic layers in the direction of width in a number of pieces smaller than a final number of the laminated layers, followed by heating and pressing in the direction of lamination to form a pre-laminate;

a second temporarily press-adhering step of cutting the pre-laminate into a plurality of pieces in the direction of width, laminating a plurality of the pre-laminates that have been cut, heating and pressing the pre-laminates in the direction of lamination to form a new pre-laminate;

a unit-cutting step of forming a unit body having a width that includes a piece of ceramic layer in the direction of width and having a number of layers smaller than the final number of the laminated layers by cutting the pre-laminate obtained by conducting the second temporarily press-adhering step one time or a plurality of number of times into a plurality of pieces in the direction of width;

a main press-adhering step of laminating a plurality of the unit bodies so that the ceramic layers are laminated in the final number of the laminated layers, and heating and pressing the unit bodies in the direction of lamination to obtain the ceramic laminate;

a dewaxing step of heating and removing not less than 90% of a binder resin contained in the ceramic layers of the ceramic laminate after the main press-adhering step has been finished; and a sintering step of sintering the ceramic laminate.

The invention according to this aspect is the one in which the second temporarily press-adhering step is added to the above first aspect of the invention. The second temporarily press-adhering step is conducted one time or a plurality of number of times.

That is, the pre-laminate obtained through the first temporarily press-adhering step is subjected to the second temporarily pre-adhering step that is conducted one time or a plurality of number of times to increase the number of the layers while decreasing the width. Then, the unit body is obtained through the unit-cutting step. The subsequent steps are the same as those of the first invention.

In this aspect of the invention, the second temporarily press-adhering step is added to increase the number of the layers of the pre-laminate prior to conducting the unit-cutting step. This makes it possible to increase the number of the layers of the unit body and, hence, to further improve the stability of the main press-adhering step.

In other respects, the action and effect are the same as those of the first invention.

According to the third aspect of the invention, there is provided a method of producing a ceramic laminate by laminating a plurality of pieces of ceramic layers, comprising:

a first temporarily press-adhering step of laminating wide ceramic sheets including a plurality of ceramic layers in the direction of width in a number of pieces smaller than a final number of the laminated layers, followed by heating and pressing in the direction of lamination to form a pre-laminate;

a unit-cutting step of forming a unit body having a width that includes a piece of ceramic layer in the direction of width and having a number of layers smaller than the final number of the laminated layers by cutting the pre-laminate into a plurality of pieces in the direction of width;

a second temporarily press-adhering step of forming a unit body having a number of layers smaller than the final number of the laminated layers by repeating one or a plurality of number of times the procedure for forming a new unit body by laminating a plurality of the unit bodies, and heating and pressing the unit bodies in the direction of lamination;

a main press-adhering step of laminating a plurality of the unit bodies so that the ceramic layers are laminated in the final number of the laminated layers, and heating and pressing the unit bodies in the direction of lamination to obtain the ceramic laminate;

a dewaxing step of heating and removing not less than 90% of a binder resin contained in the ceramic layers of the ceramic laminate after the main press-adhering step has been finished; and a sintering step of sintering the ceramic laminate.

The third aspect of the invention is different from the first aspect of the invention which obtains the final laminate through one time of press-adhesion with respect to that a plurality of unit bodies that are cut are laminated to obtain a second temporarily press-adhered laminate. The third invention is further different from the second invention with respect to that it does not effect the cutting after the second temporary press-adhesion has been finished.

In the above first to third aspects of the invention and in a fifth aspect of the invention that will be described below, the final number of the laminated layers stands for that of when the dewaxing and sintering are conducted. When really used for the actuators, the final number of the laminated layers may be that of during the sintering. Or, the laminates after the sintering may be further stacked in a plurality of number by using an adhesive or by soldering.

In the final laminate, further, the ceramic layers and the inner electrodes may not necessarily be alternately formed from the uppermost layer through down to the lowermost layer. For example, the laminate may include 10 ceramic layers without an inner electrode at the uppermost end and at the lowermost end. In the method of producing this structure, the unit bodies without an internal electrode may be prepared and laminated at the upper and lower ends. Or, the unit bodies without an internal electrode may be prepared at an equal interval, and may be laminated.

Next, the fourth and fifth aspects of the invention, intended to solve the problem B, will be described.

According to the fourth aspect of the invention, there is provided a method of producing a ceramic laminate by alternately laminating ceramic layers and internal electrode layers, comprising:

a press-adhering step of forming a pre-laminate by laminating wide ceramic sheets including a plurality of ceramic layers in the direction of width, and heating and pressing them in the direction of lamination;

a unit-cutting step of forming a unit body having a width that includes a piece of ceramic layer in the direction of width by so punching the pre-laminate as to assume a polygonal outer circumferential shape of which the inner angles are all not smaller than 90° or to assume a smoothly curved outer circumferential shape;

a dewaxing step of heating and removing not less than 90% of a binder resin contained in the ceramic layers of the unit body; and a sintering step of sintering the unit body.

In this aspect of the invention, the pre-laminate is fabricated through the press-adhering step and is, then, cut into a plurality of unit bodies through the unit-cutting step. In this case, the unit body is so punched as to assume a polygonal outer circumferential shape of which the inner angles are all not smaller than 90° or to assume a smoothly curved outer circumferential shape.

Therefore, punching stress is hardly concentrated at the time of punching in the unit-cutting step. Accordingly, in the unit body that is cut, the internal electrode layer is not being greatly deformed. Even after the dewaxing step and sintering step, therefore, the delamination and cracks do not stem from the deformation of the internal electrode layers.

The unit-cutting step cuts the pre-laminate which has been formed by laminating a plurality of ceramic sheets in advance. Hence, the unit body can be handled in a unit of a number of the layers of the pre-laminate, and the production efficiency does not decrease unlike the case of when the ceramic layers are handled piece by piece.

According to the present invention, therefore, there is provided a method of producing a ceramic laminate that features high reliability without decreasing the production efficiency and suppressing the deformation of internal electrode layers.

As described above, the present invention is concerned with a method of producing a ceramic laminate by alternately laminating ceramic layers and internal electrode layers. Here, it need not be pointed out that the concept of the ceramic laminate includes those in which potions thereof are constituted by the lamination of ceramic layers.

According to the fifth aspect of the invention, there is provided a method of producing a ceramic laminate by alternately laminating ceramic layers and internal electrode layers, comprising:

a primary press-adhering step (temporarily press-adhering step) of forming a pre-laminate by laminating wide ceramic sheets including a plurality of ceramic layers in the direction of width in a number of pieces smaller than a final number of the laminated layers, and heating and pressing them in the direction of lamination;

a unit-cutting step of forming a unit body having a width that includes a piece of ceramic layer in the direction of width and having layers laminated in a number smaller than the final number of the laminated layers by so punching the pre-laminate as to substantially assume a circular shape, a barrel shape or an octagonal shape in the direction of width;

a secondary press-adhering step (main press-adhering step) of forming a ceramic laminate of the cylindrical shape, the barrel shape or the octagonal shape by laminating a plurality of the unit bodies, heating and pressing them in the direction of lamination;

a dewaxing step of heating and removing not less than 90% of a binder resin contained in the ceramic layers of the ceramic laminate;

a sintering step of sintering the ceramic laminate; and a grinding step of grinding or cutting two or more side portions of the cylindrical ceramic laminate to form two or more flat side portions.

Then, as shown, twenty unit bodies 115 in a laminated form are inserted in the recessed portion 713 of the first side jig 711. Then, the second side jig 712 is placed on the first side jig 711. In this state, the end jigs 72 are inserted in the recessed portion 713 of the first side jig 711 from both ends of the side jig 71 to conduct the step of thermal press-adhesion.

In the present invention, further, the grinding step is conducted after the sintering step to form two or more flat portions on the side surface. Therefore, the ceramic laminate which had assumed the cylindrical shape up to the sintering step can, now, be formed in a barrel shape, in a polygonal shape or in any other desired shape in cross section. The side electrodes can, therefore, be arranged by utilizing the side flat portions without permitting the outer diameter to become large.

In other respects, the action and effect are the same as those of the fourth aspect of the invention.

BRIEF DESCRIPTION OF THE DRAWINGS

FIG. 1 is a diagram illustrating the steps of production according to Example 1;

FIGS. 29(a) to 29(d) are views illustrating the steps of production according to Example 8;

FIG. 30 is a perspective view of a ceramic laminate according to Example 8;

FIG. 36(a) to 36(c) are views illustrating the shapes of the internal electrode layers according to Example 11.

DESCRIPTION OF THE PREFERRED EMBODIMENTS

Figure 2A:
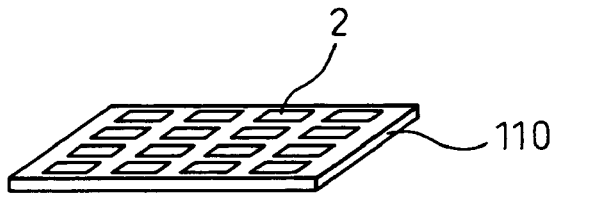
FIGS. 2(a) to 2(f) are views illustrating the steps of production according to Example 1.

I. Concerning the Problem A:

In the first, second and third aspects of the inventions, it is desired that the aspect ratio is not smaller than 1, the aspect ratio being a ratio of the size of the ceramic laminate in the direction of lamination to the size thereof in the direction of width at right angles thereto. A longitudinally elongated ceramic laminate having the aspect ratio of not smaller than 1, is highly probable to develop delamination and cracking. Therefore, employment of the above-mentioned production is very effective. When the aspect ratio is not smaller than 3, in particular, the effect becomes conspicuous.

It is further desired that the heating temperature in the temporarily press-adhering step is lower than, or is the same as, the heating temperature in the main press-adhering step. Therefore, a reliable press-adhering action is obtained relying on the thermal press-adhesion in the main press-adhering step. When the heating temperature in the temporarily press-adhering step is higher than the heating temperature in the main press-adhering step, on the other hand, the press-adhering action may often not be obtained to a sufficient degree in the main press-adhering step.

It is further desired that the pressing force in the temporarily press-adhering step is smaller than, or is equal to, the pressing force in the main press-adhering step. In this case, too, the press-adhering action is reliably obtained due to the thermal press-adhesion in the main press-adhering step. When the pressing force in the temporarily press-adhering step is larger than the pressing force in the main press-adhering step, the press-adhering action may often not be obtained to a sufficient degree in the main press-adhering step.

It is further desired that the heating temperature in the temporarily press-adhering step is not lower than a glass transition point of a binder resin contained in the ceramic layer. When the heating temperature in the temporarily press-adhering step is lower than the glass transition point, the press-adhering action is not often obtained to a sufficient degree.

It is further desired that the heating temperature in the main press-adhering step is higher than the heating temperature of the temporarily press-adhering step by more than 20 degrees but is lower than the thermal decomposition temperature of the binder resin, when the heating temperature in the main press-adhering step is not higher than the heating temperature of the temporarily press-adhering step by more than 20 degrees, there occurs such an effect that the low-molecular components in the binder resin are vaporized in the temporarily press-adhering step, and the sufficiently press-adhered state may not be obtained. When the heating temperature in the main press-adhering step is higher than the thermal decomposition temperature of the binder resin, on the other hand, the binder resin components are almost all vaporized, and the press-adhesion is not accomplished to a sufficient degree.

In the temporarily press-adhering step, it is desired that the pressing force is applied from the direction of lamination only and in the main press-adhering step, it is desired that the laminate is locked from the side direction at right angles with the direction of lamination, and the pressing force is applied from the direction of lamination. In the temporarily press-adhering step, therefore, the pressing force is nearly uniformly exerted from the axial direction to suppress the occurrence of damage. In the main press-adhering step, the pressing forces are applied from the direction of lamination and from the side direction in combination, making it possible to obtain a ceramic laminate having an excellently laminated shape. This excellent shape is maintained even in the subsequent dewaxing step and in the sintering step. Even when the cutting step or the grinding step is conducted, for trimming the shape of the ceramic laminate after the sintering step, therefore, the cutting needs be done to a minimum degree, making it possible to rationalize the steps.

It is further desired that the ceramic layer comprises piezoelectric ceramics, and the ceramic laminate is the one for a piezo-actuator constituted by alternately laminating the ceramic layers and the internal electrode layers. That is, the piezo-actuator which employs a laminate of piezoelectric ceramics generates a large force when it is driven and produces a large displacement causing, therefore, a problem of delamination and cracks. Accordingly, the above-mentioned production method can be effectively employed.

The piezo-actuator can be used for controlling, for example, a valve of an injector that injects fuel into the engine. In this case, the piezo-actuator is used under severe conditions. Durability, however, can be effectively improved by employing the above-mentioned production method.

II. Concerning the Problem B:

According to the fourth aspect of the invention, the pre-laminate is punched in the unit-cutting step in a manner as to assume a polygonal outer circumferential shape of which the inner angles are all not smaller than 90° or to assume a smoothly curved outer circumferential shape as described above. Here, the polygonal shape of which the inner angles are all not smaller than 90° has a concept which includes a pentagon and higher polygons. Among them, an octagon and higher polygons are desired. Further, a smoothly curved outer circumferential shape stands for a shape without the corners possessed by polygons. Examples include those shapes obtained by chamfering the corners of polygons to assume an arcuate shape, a circular shape, an oval shape and a race-track shape.

The second press-adhering step can be conducted between the unit-cutting step and the dewaxing step to laminate a plurality of the unit bodies, to heat them, and to press them in the direction of lamination. In this case, the unit bodies are laminated in a plural number to obtain a ceramic laminate having a relatively large length of lamination.

In the first invention, further, the ceramic laminate can be constituted by one unit body.

In the unit-cutting step, further, it is desired that the punching shape is substantially a circular shape, a shape of a barrel or an octagonal shape. In this case, the concentration of stress at the time of punching can be more reliably suppressed in the unit-cutting step.

It is desired that the internal electrode layers have a thickness which is from $1/100$ to $1/10$ the thickness of the ceramic layer. The smaller the thickness of the internal electrode layers is, the less the delamination and cracks are probable to occur. It is therefore desired that the inner electrode layers have a thickness which is not larger than $1/10$ the thickness of the ceramic layer. In order to stably maintain electric properties of the internal electrode layers, on the other hand, it is desired that the thickness thereof is not smaller than $1/100$ the thickness of the ceramic layer.

When the resin component contained in the ceramic layer has a glass transition point G (° C.), it is desired that the unit-cutting step effects the cutting at a temperature in a range of from $-70$ (° C.) to G (° C.). In the above unit-cutting step as described above, the pre-laminate obtained by laminating a plurality of pieces of ceramic sheets is punched. The punching performance is effectively improved by increasing the modulus of elasticity of the ceramic sheets. This is effectively done by lowering the temperature of the pre-laminate. For this purpose, it is desired that the temperature is maintained to be not higher than the glass transition point G (° C.) of the resin component contained in the ceramic layer, i.e., in the ceramic sheets. When the temperature of the pre-laminate is maintained to be too low, frost easily forms on the surfaces depending upon the atmosphere. The presence of the frost has adverse affects, such as forming bubbles in the subsequent dewaxing step and in the sintering step. It is therefore desired that the pre-laminate is maintained at a temperature of not lower than $-70°$ C. and, more preferably, not lower than $-30°$ C.

It is desired that the ceramic laminate is the one for a piezo-actuator. When used for the piezo-actuator, the ceramic layer has a small thickness, the number of the layers is increased, and a shape having a large aspect ratio is employed. In this case, therefore, the delamination and cracks tend to occur easily. Therefore, employment of the above production method is effective.

It is further desired that the unit-cutting step is conducted by using a punch having an end surface of a desired shape and a die having a punching hole in which the punch can be inserted maintaining a predetermined clearance, and that at least either the punch or the die has a protuberance along the cutting shape. In this case, a slot can be formed prior to effecting the shearing by the punch and the die; i.e., the shearing is smoothly effected by the punch and by the die. This makes it possible to further suppress the deformation of the ceramic layers and of the internal electrode layers caused by the shearing stress.

Further, the punching step is conducted by using a punch having an end surface of a desired shape, a die having a punching hole in which the punch can be inserted maintaining a predetermined clearance, and a stripper which is provided surrounding the punch to retractably protrude separately from the punch and having a protuberance at the end thereof, wherein the stripper is advanced to the pre-laminate placed on the die and the protuberance thereof is stabbed half into the thickness of the pre-laminate to form a slot therein and, then, the punch is advanced to punch the pre-laminate thereby to form the unit body. In this case, too, the slot can be formed by the protuberance prior to effecting the shearing by the punch and by the die to smoothly conduct the shearing by the punch and by the die. This makes it possible to further suppress the deformation of the ceramic layers and of the internal electrode layers caused by the shearing stress.

It is desired that the punching hole of the die is provided with a receiving plate for receiving the unit bodies that are punched, and the unit bodies, produced through the punching step that is continuously executed, are successively laminated on the receiving plate. In this case, a plurality of unit bodies can be handled in a press-adhered state to rationalize the production.

The following Examples 1 and 2 are related to the above-mentioned problem A, and Examples 3 to 11 are related to the above-mentioned problem B.

EXAMPLE 1

An Example related to the method of producing the ceramic laminate of the invention will now be described with reference to FIGS. 1 to 7.

Figure 7:
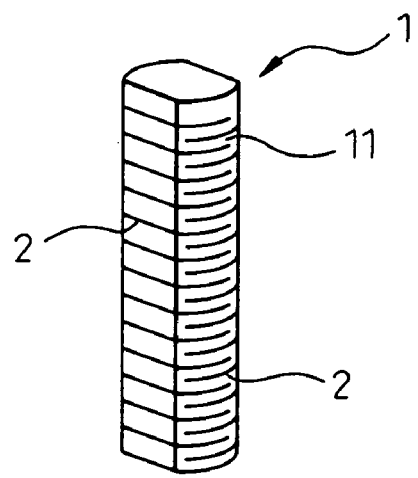
FIG. 7 is a perspective view illustrating a ceramic laminate that is obtained according to Example 1.

As shown in FIG. 7, this Example is to produce a ceramic laminate 1 by laminating a plurality of pieces of ceramic layers 11. The ceramic laminate 1 of this Example is for use as a piezo-actuator and in which the ceramic layers 11 are formed of piezo-electric ceramics, and the ceramic layers 11 and internal electrode layers 2 alternately laminated one upon the other. Further, the ceramic laminate 1 of this Example has an aspect ratio which is not smaller than 3.

In producing the ceramic laminate 1 in this Example as shown in FIG. 1, there are conducted at least the following temporarily press-adhering step S4, unit-cutting step S5, main press-adhering step S6, dewaxing step S7 and sintering step S8.

The temporarily press-adhering step S4 is for forming a pre-laminae 111 by laminating wide ceramic sheets 110 including a plurality of ceramic layers 11 in the direction of width in a number of pieces smaller than a final number of the laminated layers, followed by heating and pressing in the direction of lamination.

The unit-cutting step S5 is for forming a unit body 115 having a width that includes a piece of ceramic layer 11 in the direction of width and having a number of layers smaller than the final number of the laminated layers by cutting the pre-laminate 111 into a plurality of pieces in the direction of width.

The main press-adhering step S6 is for forming the ceramic laminate 1 by laminating a plurality of the unit bodies 115 so that the ceramic layers 11 are laminated in the final number of the laminated layers, and heating and pressing the unit bodies in the direction of lamination.

The dewaxing step S7 is for heating and removing not less than 90% of a binder resin contained in the ceramic layers 11 of the ceramic laminate 1 after the main press-adhering step has been finished.

The sintering step S8 is for sintering the ceramic laminate 1 after the dewaxing step has been finished.

These steps will now be described in detail.

In producing the ceramic laminate 1 in this Example as shown in FIG. 1, first, there are conducted a sheet-forming step S1 of forming a long ceramic sheet from which the ceramic layers 11 are to be obtained, and a sheet-punching step S2 of punching the ceramic sheet 110 (FIGS. 2(a) to FIG. 2(f)) of a predetermined size from the long ceramic sheet.

The sheet-forming step S1 may employ a doctor blade method, an extrusion-molding method or any other method. In this Example, a long ceramic sheet is prepared being wound like a roll by the doctor blade method. The starting material has been so adjusted as to form desired piezo-electric ceramics after the sintering. Though a variety of starting materials can be used, this Example uses the one that forms PZT (lead zirconate titanate).

In the sheet-punching step S2, the ceramic sheet 110 of a size from which 16 pieces of ceramic layers 11 can be obtained, is cut out from the long ceramic sheet.

Referring next to FIGS. 1 and 2(a), a step S3 is conducted for printing internal electrodes. In this step, a pattern of an internal electrode layer 2 is printed on each ceramic sheet 110. Here, the internal electrode layer 2 is so printed that a blank portion 15 (FIG. 5) is finally formed on the ceramic layer 11.

Figure 2B:
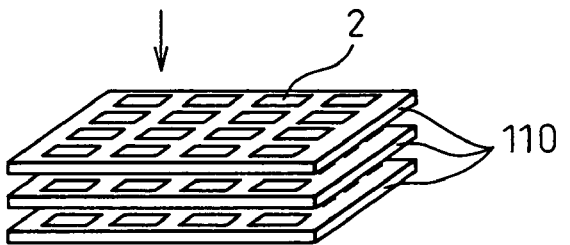
Figure 2C:
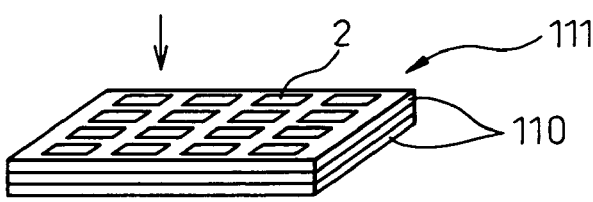

Then, the temporarily press-adhering step S4 is conducted as shown in FIGS. 1, 2(b) and 2(c). In the temporarily press-adhering step S4, ten pieces of the ceramic sheets 110 on which the internal electrode layer 2 has been printed are laminated and are thermally press-adhered. In FIGS. 2(a) to 2(f), only a small number of pieces are diagramed for easy understanding. The conditions of thermal press-adhesion here are such that the temperature and pressure are lower than those of the main press-adhering step S6 that will be described later. Concretely speaking, the conditions are such that the heating temperature is 80° C., the pressure is 5 MPa, and the pressing is effected from the up-and-down direction only by using a jig (not shown) for 3 minutes.

The ceramic sheets 110 are laminated in such a manner that the positions of the blank portions 15 where there exists no internal electrode 2 are alternately deviated toward the right and left in a laminated state. Thus, there is obtained a wide pre-laminate 111.

Figure 2D:
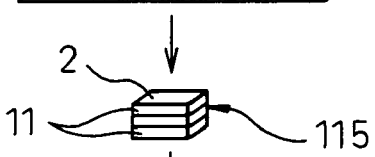
Figure 2E:
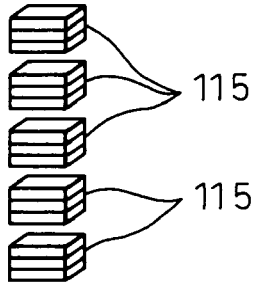

Referring next to FIGS. 1 and 2(d), the unit-cutting step S5 is conducted. In the unit-cutting step S5, the pre-laminate 111 consisting of ten pieces of the ceramic sheets 110 that are laminated is cut into a plurality of units in the direction of width. Therefore, sixteen unit bodies 115 each having a width to include a piece of ceramic layer in the direction of width and having ten pieces of ceramic layers which are temporarily press-adhered, are obtained from each pre-laminate 111.

Referring next to FIGS. 1, 2(e), 2(f), 3 and 4, twenty unit bodies 115 are laminated to conduct the main press-adhering step S6.

Figure 3:
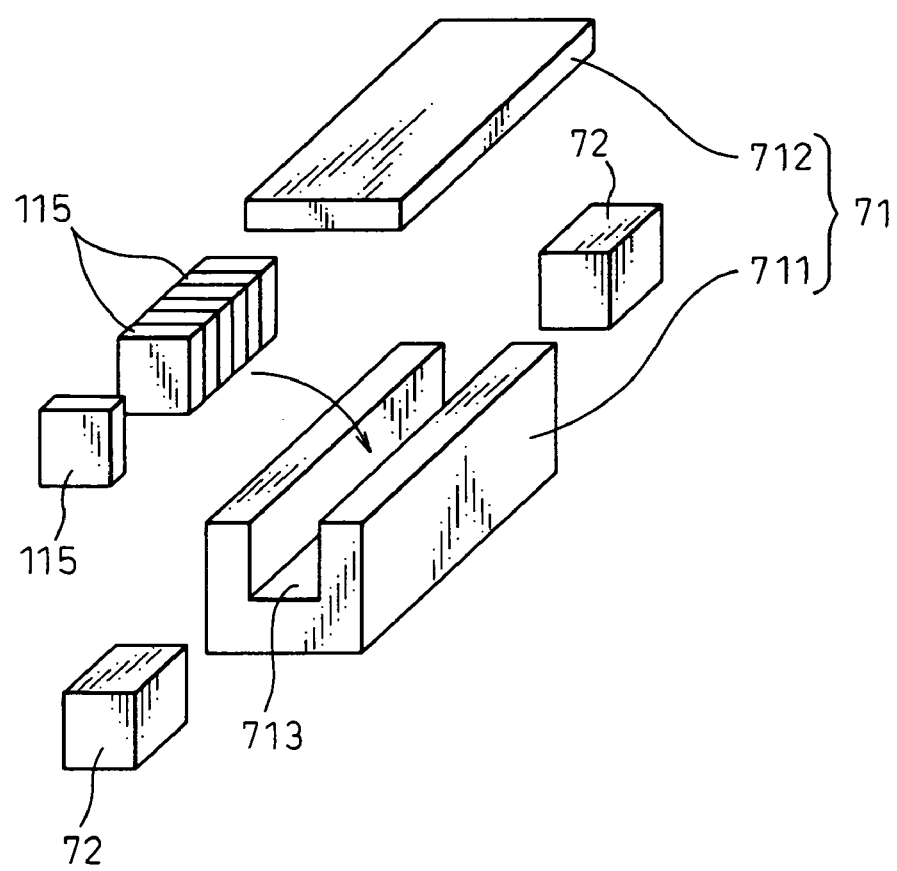
FIG. 3 is a view illustrating a jig used for the thermal press-adhering step according to Example 1.
Figure 4:
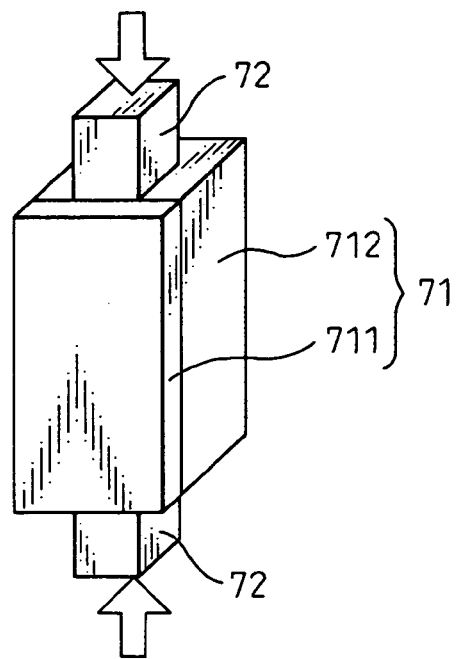
FIG. 4 is a view illustrating a state of conducting the thermal press-adhering step according to Example 1.

Concretely speaking as shown in FIG. 3, use is made, as a side jig 71, of a first side jig 711 of a U-shape in cross section and a second side jig 712 to be placed thereon. There are further used a pair of end jigs 72 that can be inserted in the recessed portion 713 of the first side jig 711.

Then, as shown, twenty unit bodies 115 in a laminated form are inserted in the recessed portion 713 of the first side jig 711. Then, the second side jig 712 is placed on the first side jig 712. In this state, the end jigs 72 are inserted in the recessed portion 713 of the first side jig 711 from both ends of the side jig 71 to conduct the step of thermal press-adhesion.

In this Example, the heating temperature is 120° C. and the pressing force in the direction of lamination from the end of the jig 72 is 34 MPa. Further, the pressing time is 3 minutes. The heating temperature can be varied over a range of from 100 to 250° C. The pressing force can be varied over a range of from 5 to 100 MPa. The time for pressing and heating can be changed depending upon the size of the ceramic layers 11 and the number of the laminated layers.

Figure 2F:
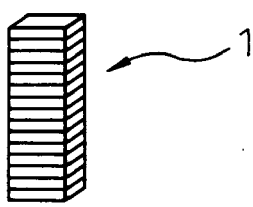

In this embodiment, the pressing force is removed after the heating and pressing are conducted for a predetermined period time in the main press-adhering step S6, the jigs 72 are removed, and the side jig 71 is disassembled. Thus, there is obtained a ceramic laminate 1 of a rectangular prism shape as shown in FIG. 2(f).

Figure 5:
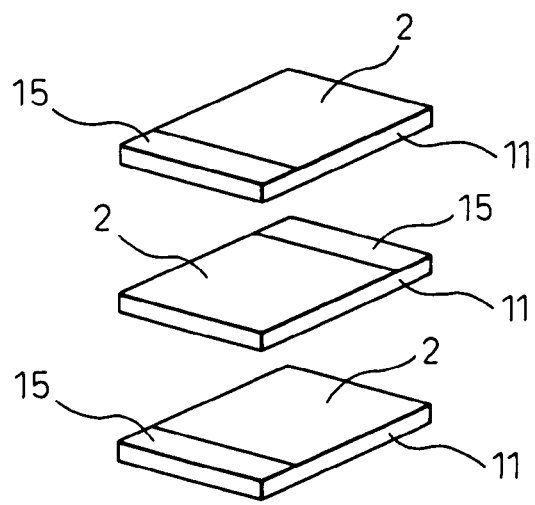
FIG. 5 is a view illustrating a state of laminating the ceramic layers according to Example 1.

FIG. 5 is an expansion plan of the ceramic laminate 1. As shown in FIG. 5, the ceramic layers 11 and the internal electrode layers 2 constituting the ceramic laminate 1 are of a square shape. The ceramic laminate 1 includes blank portions 15 without internal electrode layer 2 alternately on the two opposing sides 101 and 102 among the neighboring ceramic layers 11.

Then, as shown in FIG. 1, the dewaxing step S7 is conducted to heat and remove not less than 90% of the binder resin contained in the ceramic layers 11 of the ceramic laminate 1. Concretely speaking, the ceramic laminate 1 is heated in an atmosphere or in an $N_2$ atmosphere at a temperature of 350° C. for 5 hours to remove the binder resin.

Then, as shown in FIG. 1, the sintering step S8 is conducted to fire the ceramic laminate 1 after the dewaxing. In this Example, the sintering is conducted under the conditions of a temperature of 1100° C. for 2 hours.

In this Example as shown in FIG. 1, further, the step S9 is conducted for grinding the side surfaces.

Figure 6:
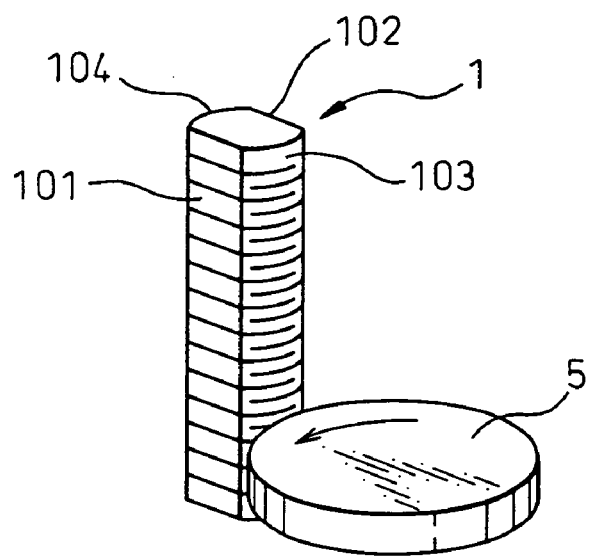
FIG. 6 is a view illustrating a state of conducting the step of grinding the side surfaces according to Example 1.

Referring to FIG. 6, side surfaces 101 to 104 are ground by using a grind stone 5. In this Example in this case, the side surfaces 101 and 102 having a blank portion 15 are ground flat, and the side surfaces 103 and 104 without blank portion 15 are ground arcuately. Thus, there is obtained the ceramic laminate 1 having a barrel shape in cross section.

Next, described below are the action and effect of this Example.

In the process of production in this Example as described above, the temporarily press-adhering step S4 and the unit-cutting step S5 are conducted and, then, the main press-adhering step S6 is conducted followed by the dewaxing step S7 and the sintering step S8.

In the temporarily press-adhering step S4, the wide ceramic sheets 11 are laminated and are temporarily press-adhered. Here, since the ceramic sheets are wide, the pressing force can be nearly uniformly applied at the time of press-adhesion. Therefore, the temporarily press-adhering step S4 suppresses the occurrence of damage caused by the deviation of the pressure.

Next, the unit-cutting step S5 forms the unit body 115 cut into a width that includes a piece of ceramic layer having a basic area of the ceramic laminate 1 that is to be obtained. In the main press-adhering step S6, the unit bodies 115 are laminated and thermally press-adhered to obtain the ceramic laminate 1 having the final number of the laminated layers. In the thermal press-adhesion in this case, the unit bodies 115 are laminated and pressed. Therefore, the pressing is stably conducted as compared to when the individual ceramic layers are thermally press-adhered without using the unit bodies 115. Therefore, the main press-adhering step S6 suppresses the occurrence of damage. Besides, the unit bodies 115 have not yet been put to the dewaxing step and, hence, maintain flexibility of the ceramic layers 11 to a sufficient degree; i.e., the unit bodies 115 are not brittle and are not broken.

After the ceramic layer 1 having the final number of the laminated layers is formed through the main press-adhering step S6, the dewaxing step S7 is conducted for the ceramic laminate 1. The ceramic laminate 1 that becomes brittle after having been put through the dewaxing is now treated by the sintering step S8 only, and is seldom damaged despite becoming brittle.

As described above, the temporarily press-adhering step S4, unit-cutting step S5, main press-adhering step S6, dewaxing step S7 and sintering step S8 are successively conducted, suppressing the occurrence of damage that may occur during the production of the ceramic laminates 1. Thus, the occurrence of delamination and cracks is suppressed, and there is obtained a highly reliable ceramic laminate 1.

The ceramic laminate 1 of this Example has many layers that are laminated and has an aspect ratio of not smaller than 3. Despite of this, there is obtained the ceramic laminate 1 which does not develop delamination or cracks owing to the employment of the above-mentioned production steps.

The treating conditions are different between the temporarily press-adhering step S4 and the main press-adhering step S6; i.e., the temporarily press-adhering step S4 is conducted under the conditions of a low temperature and a low pressure. In either step, the heating temperature is not lower than the glass transition point of the binder resin contained in the ceramic layers. In the main press-adhering step S6, further, the heating temperature is set to be higher than the heating temperature of the temporarily press-adhering step S4 by more than 20 degrees but is lower than the thermal decomposition temperature of the binder resin.

Therefore, a sufficient degree of press-adhering action is accomplished by the temporarily press-adhering step S4 and, besides, a sufficient degree of press-adhering action is obtained by the main press-adhering step S6 after the temporarily press-adhering step S4. Besides, the binder resin remains in sufficient amounts even after the main press-adhering step S6. Therefore, the ceramic laminate 1 does not become brittle and maintains a sufficient degree of flexibility. Therefore, this further prevents the ceramic laminate 1 from being damaged after the main press-adhering step S6.

In this Example, further, the pressing force is applied in the temporarily press-adhering step S4 from the direction of lamination only. In the main press-adhering step S6, the pressing force is exerted from the direction of lamination by using the side jig 71 and the end jig 72 while the laminate is being held from the side direction at right angles with the direction of lamination. In the temporarily press-adhering step S4, therefore, the pressure is nearly uniformly exerted from the axial direction to further suppress the occurrence of damage.

In the main press-adhering step S6, further, the pressing forces are combined from the direction of lamination and from the side direction making it possible to obtain a ceramic laminate 1 which is excellently laminated. Therefore, an excellent shape is maintained even in the subsequent dewaxing step S7 and in the sintering step S8, and the ceramic laminate 1 needs be ground only in small amounts in the step S9 of grinding the side surfaces, enabling the steps to be rationalized.

The ceramic laminate 1 is a piezo-electric actuator utilizing a laminate of the piezo-ceramics. As described above further, ceramic laminate 1 suppresses the occurrence of delamination and cracks. Therefore, the ceramic laminate 1 exhibits excellent durability even when it is incorporated in an injector that is used under very severe conditions.

COMPARATIVE EXAMPLE 1

In order to qualitatively evaluate excellent points of the ceramic laminate 1 obtained by the production method of Example 1, another ceramic laminate is produced by a production method (Comparative Example 1) different from that of Example 1 to examine the rate of occurrence of delamination and cracks.

Figure 8:
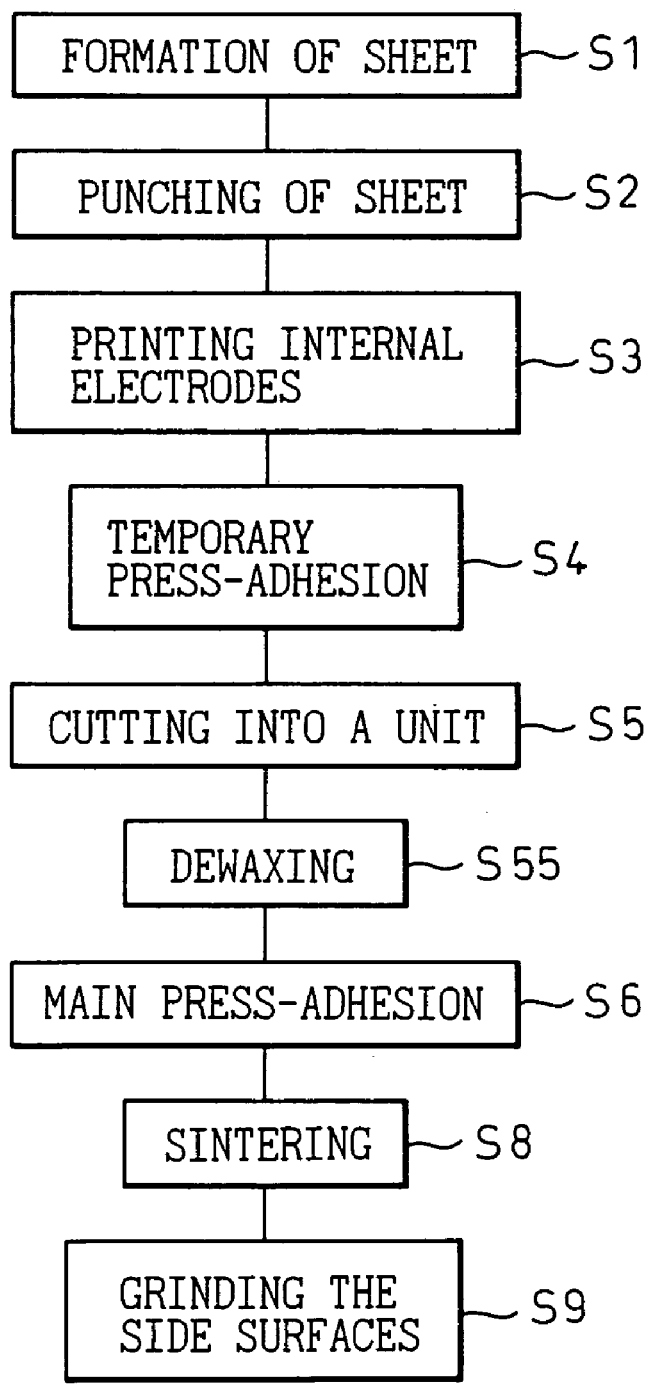
FIG. 8 is a diagram illustrating the steps of production according to Comparative Example 1.

The production method of Comparative Example 1 comprises, as shown in FIG. 8, conducting the unit-cutting step S5 and the dewaxing step S55 after the temporarily press-adhering step S4 and, then, successively conducting the main press-adhering step S6, sintering step S8 and side surface-grinding step S9. The contents of the steps are the same as those of Example 1, but the order of conducting the dewaxing step is changed.

Thirty ceramic laminates 1 are produced according to Comparative Example 1 and another 30 ceramic laminates 1 are produced according to Example 1 to examine the rate of occurrence of delamination and cracks.

Figure 9:
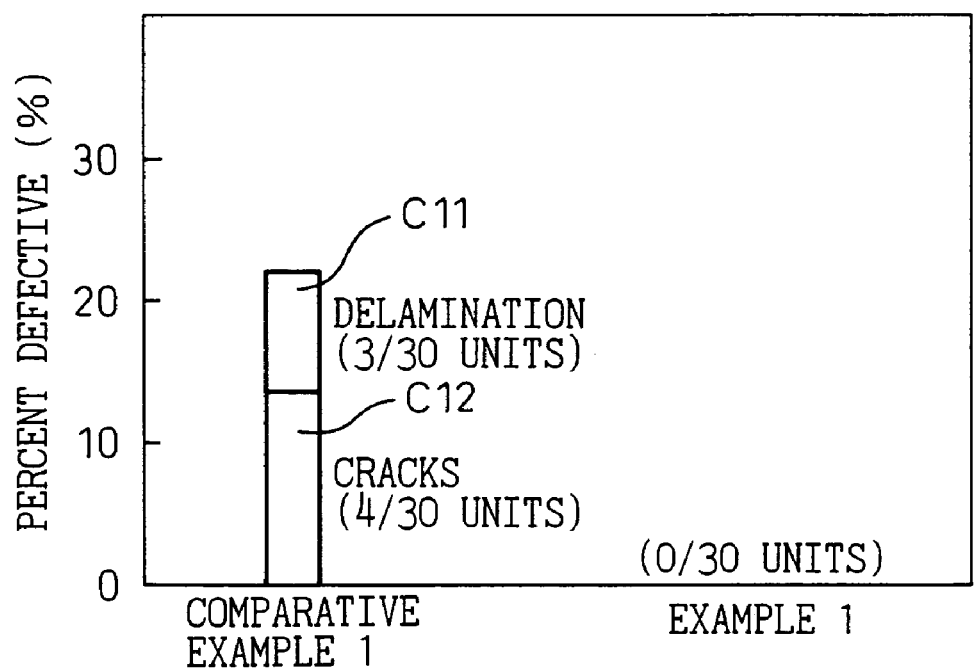
FIG. 9 is a diagram illustrating percent defective of Example 1 and of Comparative Example 1.

The results are as shown in FIG. 9 wherein the abscissa represents the kinds of production steps and the ordinate represents percent defective. It will be learned from FIG. 9 that in Comparative Example 1, the probability of occurrence of delamination C11 is 3/10, the probability of occurrence of cracks C12 is 4/30, and the overall percent defective is 23%. In the case of Example 1, on the other hand, no defect occurred.

EXAMPLE 2

Figure 10:
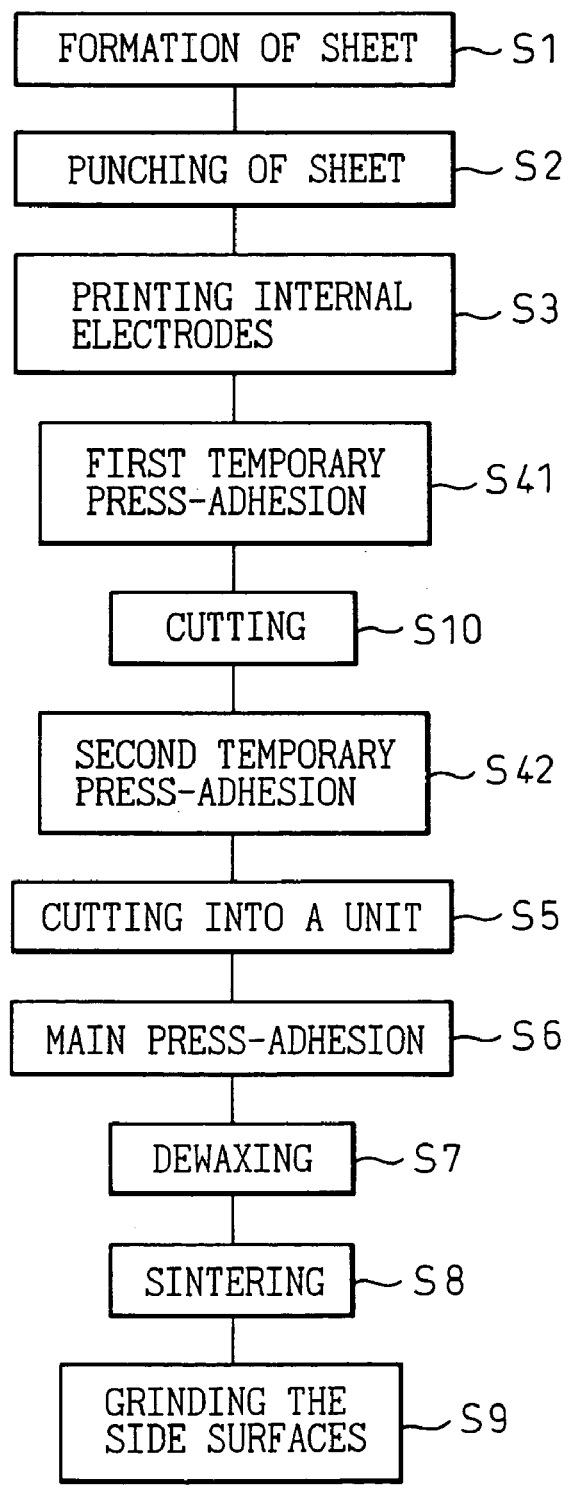
FIG. 10 is a diagram illustrating the steps of production according to Example 2.
Figure 11:
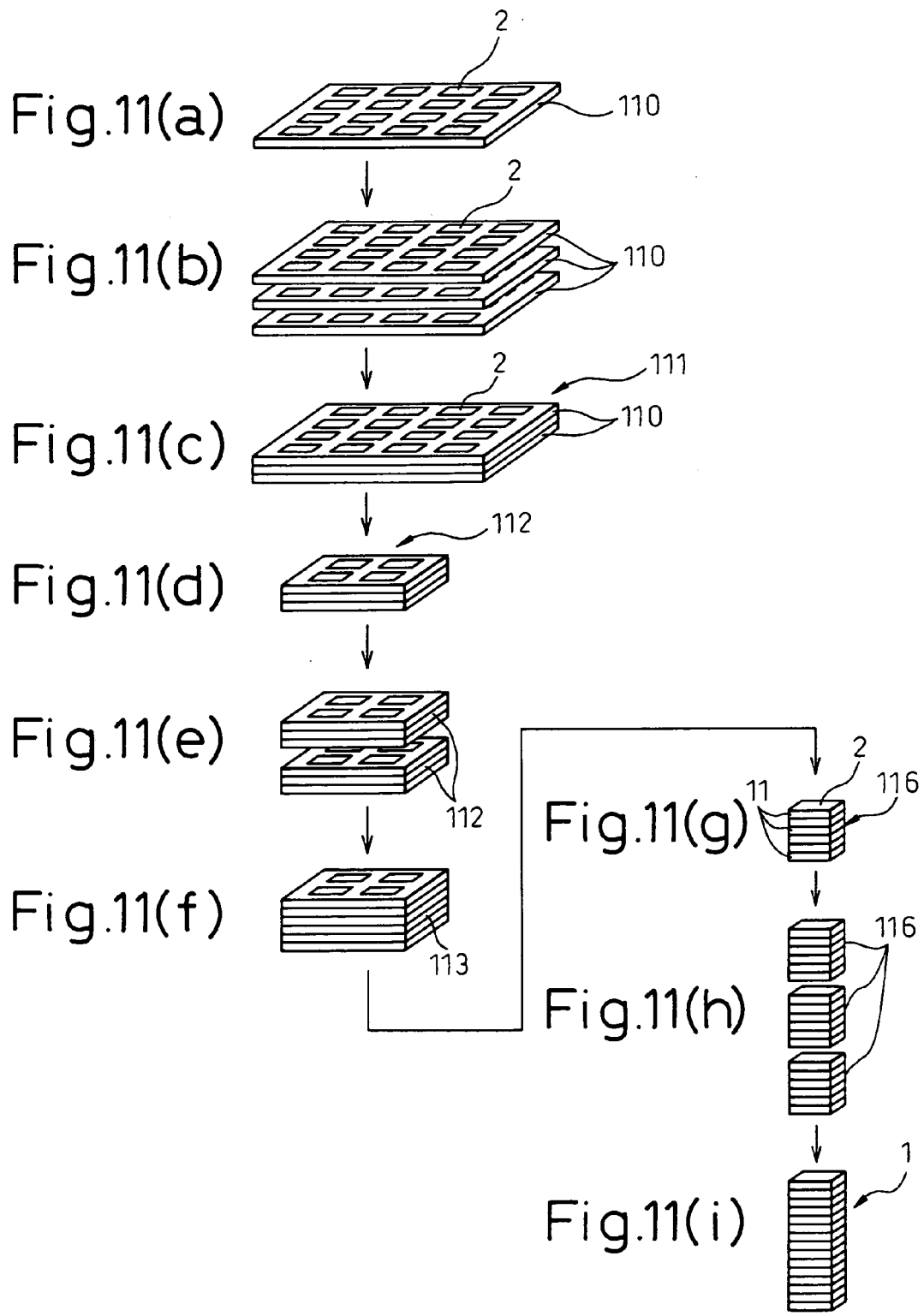
FIGS. 11(a) to 11(i) are views illustrating the steps of production according to Example 2.

In this Example as shown in FIG. 10, a first temporarily press-adhering step S41 and a second temporarily press-adhering step S42 are effected instead of the temporarily press-adhering step S4 of Example 1. As shown in FIGS. 11(b) and 11(c), the first temporarily press-adhering step S41 is the same step as the temporarily press-adhering step S4 of Example 1, and is for forming the pre-laminate 111 by laminating ten pieces of the ceramic sheets 110. In FIG. 11, too, only a decreased number of pieces are illustrated.

Next, at the second temporarily press-adhering step S42 as shown in FIGS. 11(d) to 11(f), a second pre-laminate 112 is formed by cutting the pre-laminate 111 into a size of about one-fourth through a cutting step S10. Two second pre-laminates 112 are laminated and temporarily press-adhered to form a pre-laminate 113 comprising 20 pieces of ceramic layers laminated one upon another.

Then, at the unit-cutting step S5, the pre-laminate 113 is cut to obtain a unit body 116 having a width which includes a piece of ceramic layer in the direction of width and having 20 pieces of ceramic layers that are press-adhered.

In the next main press-adhering step S6, ten unit bodies 116 are laminated and press-adhered by using the side jig 71 and the end jigs 72 like in Example 1.

In this Example, the treating conditions of the first temporarily press-adhering step S41 consist of a heating temperature of 80° C. and a pressure of 5 MPa, the treating conditions of the second temporarily press-adhering step S42 consist of a heating temperature of 100° C. and a pressure of 10 MPa, and treating conditions of the main press-adhering step S6 consist of a heating temperature of 120° C. and a pressure of 34 MPa. The conditions of higher temperatures and higher pressures are employed for the subsequent steps.

After the main press-adhering step S6, there are conducted the dewaxing step S7 and the sintering step S8 as in Example 1. In other respects, this Example is the same as Example 1.

In the case of this Example as described above, the second temporarily press-adhering step S44 is added. A separate pre-laminate 113 having an increased number of the laminated layers and a decreased width is formed from the pre-laminate 111 obtained in the first temporarily press-adhering step S41 and, then, the unit-cutting step S5 and the subsequent steps are conducted.

Therefore, this Example makes it possible to increase the number of the laminated layers of the unit body 116 and to further stably conduct the main press-adhering step S6.

The action and effect in other respects are the same as those of Example 1.

In the above Example, the patterns for printing the internal electrode layers are a total of 4×4=16 for each ceramic sheet. The present invention, however, is in no way limited thereto only, and the patterns may be, for example, a total of 7×6=42, or any other patterns may be employed.

EXAMPLE 3

A method of producing a ceramic laminate according to Example 3 of the invention will now be described with reference to FIGS. 12 to 20.

Figure 12:
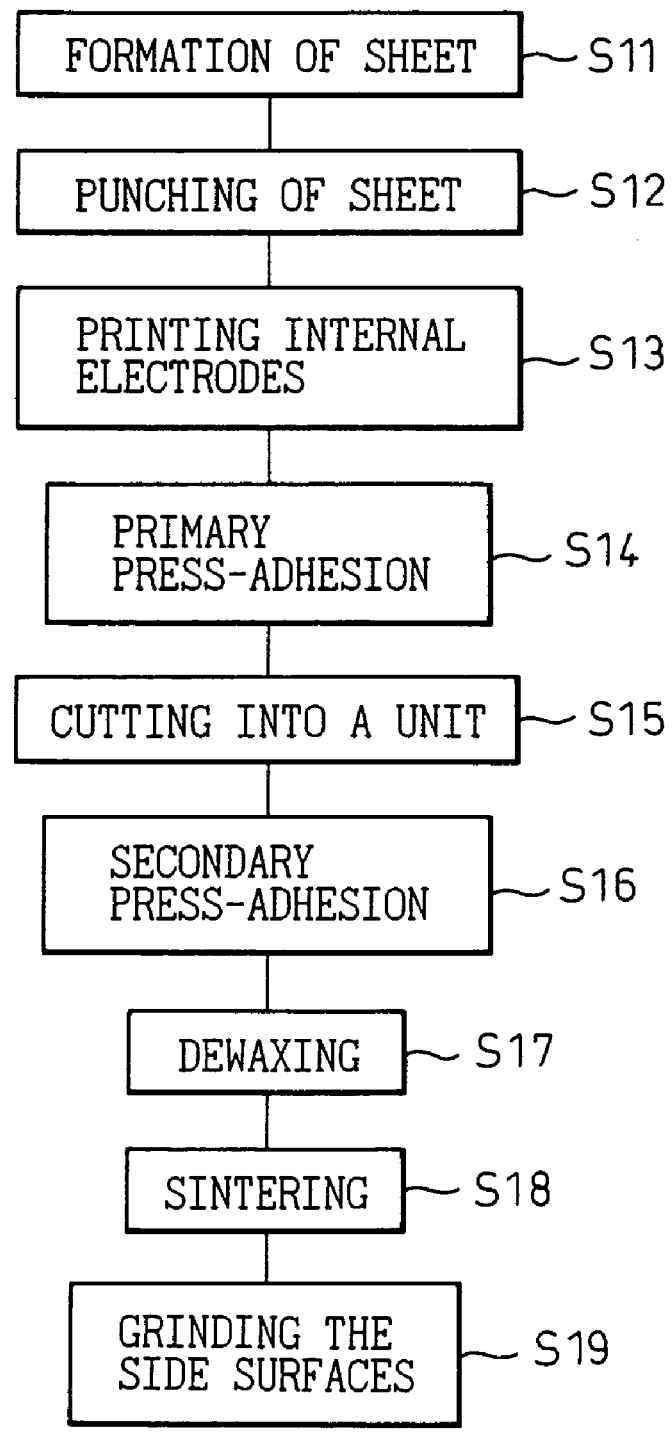
FIG. 12 is a diagram illustrating the steps of production according to Example 3.

As shown in FIG. 12, this Example is to produce the ceramic laminate 1 by alternately laminating the ceramic layers 11 and the internal electrode layers 2.

As shown in FIG. 12, the production method executes at least a primary press-adhering step S14, a unit-cutting step S15, a secondary press-adhering step S16, a dewaxing step S17 and a sintering step S18.

Figure 13A:
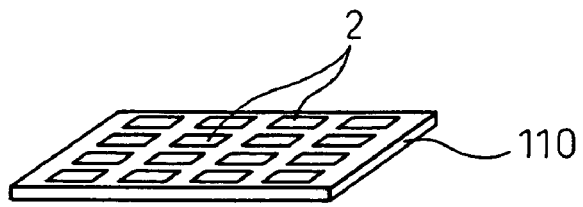
FIGS. 13(a) to 13(f) are views illustrating the steps of production according to Example 3.
Figure 13B:
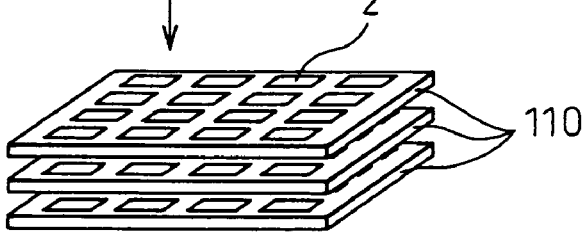
Figure 13C:
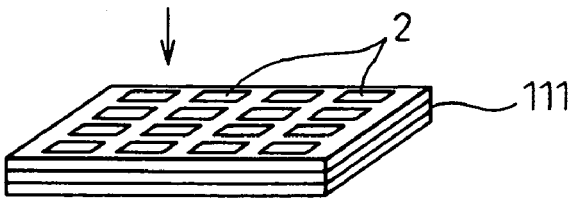

As shown in FIGS. 13(a) to 13(c), the primary press-adhering step S14 is for forming a pre-laminate 111 by laminating wide ceramic sheets 110 including a plurality of ceramic layers 11 in the direction of width in a number of pieces smaller than a final number of the laminated layers, followed by heating and pressing in the direction of lamination.

Figure 13D:
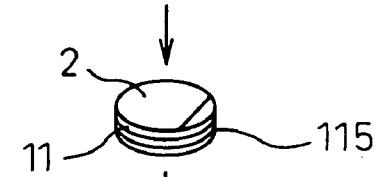

The unit-cutting step S15 is for forming, as shown in FIG. 13(d), a unit body 115 having a width that includes a piece of ceramic layer in the direction of width and having a number of layers smaller than the final number of the laminated layers by punching the pre-laminate 111 so as to possess a smoothly curved outer circumference (circular shape in this Example).

Figure 13E:
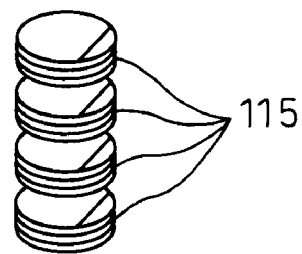
Figure 15:
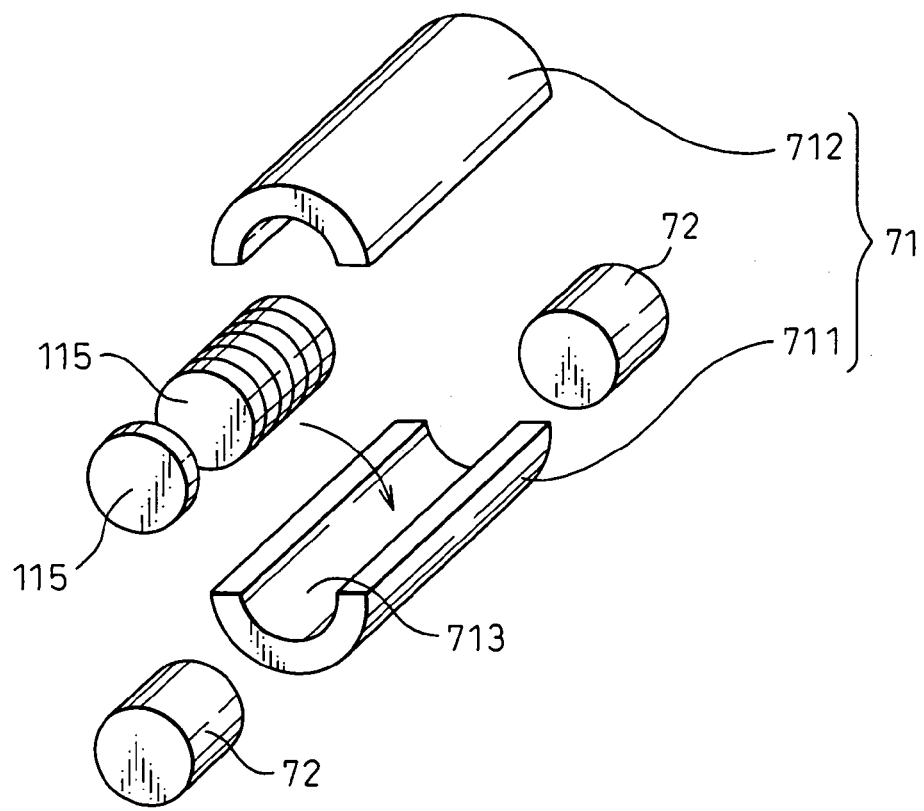
FIG. 15 is a view illustrating a jig used for the thermal press-adhering step according to Example 3.
Figure 16:
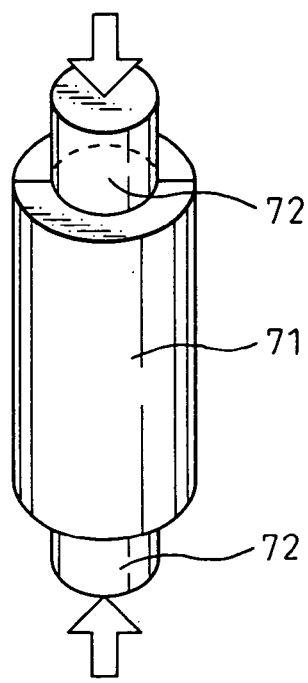
FIG. 16 is a view illustrating a state of conducting the thermal press-adhering step according to Example 3.

The secondary press-adhering step S16 is for forming, as shown in FIGS. 13(e), 15 and 16, the ceramic laminate 1 by laminating a plurality of the unit bodies 115, and heating and pressing the unit bodies in the direction of lamination.

The dewaxing step S17 is for heating and removing not less than 90% of a binder resin contained in the ceramic layers 11 of the ceramic laminate 1.

The sintering step S18 is for sintering the ceramic laminate 1.

These steps will now be described in detail.

In producing the ceramic laminate 1 in this Example as shown in FIG. 12, first, there are conducted a sheet-forming step S11 for forming a long ceramic sheet from which the ceramic layers 11 are to be obtained, and a sheet-punching step S12 for punching a ceramic sheet 110 (FIGS. 13(a) and 13(b)) of a predetermined size from the long ceramic sheet.

The sheet-forming step S11 may employ a doctor blade method, an extrusion-molding method or any other method. In this Example, a long ceramic sheet is prepared being wound like a roll by the doctor blade method. The starting material has been so adjusted as to form a desired piezoelectric ceramics after the sintering. Though a variety of starting materials can be used, this Example uses the one that forms PZT (lead zirconate titanate).

In the sheet-punching step S12, the ceramic sheet 110 of a size from which 16 pieces of ceramic layers 11 can be obtained, is cut out from the long ceramic sheet.

Referring next to FIGS. 12 and 13(a), a step S13 is conducted for printing internal electrodes. In this step, a pattern of an internal electrode layer 2 is printed on each ceramic sheet 110. Here, the internal electrode layer 2 is so printed that a blank portion 15 (FIG. 17) is finally formed on the ceramic layer 11.

In this Example, further, the thickness of the ceramic sheets 110 or the ceramic layers 11 is adjusted to be 80 μm after sintering, and the thickness of the internal electrodes 2 is adjusted to be 2 μm after sintering. Namely, in this Example, the final thickness of the internal electrode layers 2 is set to be 1/40 the thickness of the ceramic layers 11.

Then, the primary press-adhering step S14 is conducted as shown in FIGS. 12, 13(b) and 13(c). In the primary press-adhering step S14, ten pieces of the ceramic sheets 110 on which the internal electrode layer 2 has been printed are laminated and are thermally press-adhered. In FIGS. 13(a) to 13(f), only a small number of pieces are diagramed for easy understanding. The conditions of thermal press-adhesion here are such that the temperature and pressure are lower than those of the secondary press-adhering step S16 that will be described later. Concretely speaking, the conditions are such that the heating temperature is 80° C., the pressure is 5 MPa, and the pressing is effected from the up-and-down direction only by using a jig (not shown) for 3 minutes.

The ceramic sheets 110 are laminated in such a manner that the positions of the blank portions 15 where there exists no internal electrode 2 are alternately deviated toward the right and left in a laminated state. Thus, there is obtained a wide pre-laminate 111.

Figure 14:
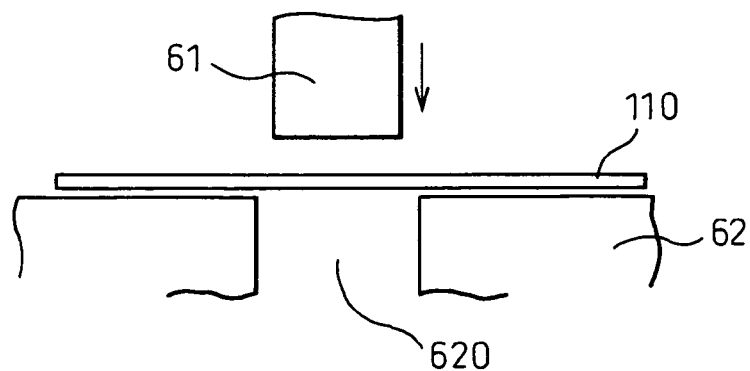
FIG. 14 is a view illustrating a device used for the unit-cutting step according to Example 3.

Referring next to FIGS. 12, 13(d) and 14, the unit-cutting step S15 is conducted. In the unit-cutting step S15, the pre-laminate 111 consisting of ten pieces of the ceramic sheets 110 that are laminated is cut into a plurality of units in the direction of width. Here, the pre-laminate 111 is punched so as to possess a smoothly curved outer circumference and, particularly, a cylindrical shape in this Example, thereby to obtain a disk-like unit body 111 having a width to include a piece of ceramic layer 11 in the direction of width.

In this Example as shown in FIG. 14, the punching is effected by using a punch 61 having an end of a circular shape in cross section and a die 62 having a punching hole 620 in which the punch 61 can be inserted maintaining a predetermined clearance. The punch 61 and the die 62 used here are normally used ones without protuberances.

In this Example, further, the unit-cutting step S15 is conducted at 25° C., i.e., the pre-laminate 111 is cut at 25° C. This temperature is lower than a glass transition point of 75 (° C.) of the resin binder possessed by the ceramic layer 11 and is higher than −70° C. The punching conducted at this temperature involves less deformation.

Referring next to FIGS. 12, 13(e), 13(f), 15 and 16, twenty unit bodies 115 are laminated to conduct the secondary press-adhering step S16.

Concretely speaking as shown in FIG. 15, use is made, as a side jig 71, of a first side jig 711 of a semicircular shape in cross section and a second side jig 712 of a semicircular shape in cross section to be placed thereon. There are further used a pair of end jigs 72 that are of a cylindrical shape.

Then, as shown, twenty unit bodies 115 in a laminated form are inserted in the recessed portion 713 of the first side jig 711. Then, the second side jig 712 is placed on the first side jig 712. In this state, the end jigs 72 are inserted in the recessed portion 713 of the first side jig 711 from both ends of the side jig 71 to conduct the step of thermal press-adhesion.

In this Example, the laminate and the jigs are heated in a constant-temperature vessel heated at a temperature of 120° C. for 30 minutes. Then, they are moved into a pressing machine so as to be press-adhered. In this Example, further, the pressing force in the direction of lamination from the end of the jig 72 is 34 MPa. The heating temperature can be varied over a range of from 80 to 190° C. The pressing force can be varied over a range of from 5 to 100 MPa. The time for pressing and heating can be changed depending upon the size of the ceramic layer 11 and the number of the laminated layers.

Figure 13F:
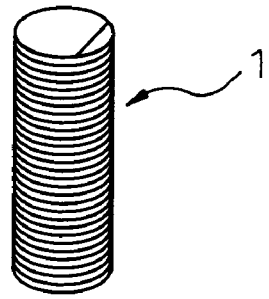

In this embodiment, the pressing force is removed after the heating and pressing are conducted for a predetermined period time in the secondary press-adhering step S16, the jigs 72 are removed, and the side jig 71 is disassembled. Thus, there is obtained a ceramic laminate 1 of a cylindrical shape as shown in FIG. 13(f).

Figure 17:
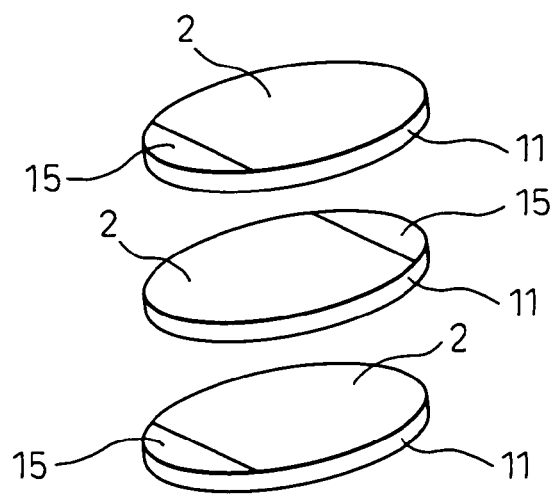
FIG. 17 is a view illustrating a state of laminating the ceramic layers according to Example 3.

FIG. 17 is an expansion plan of the ceramic laminate 1. AS shown in FIG. 17, the ceramic layers 11 and the internal electrode layers 2 constituting the ceramic laminate 1 are of a circular shape. The ceramic laminate 1 includes blank portions 15 without internal electrode layer 2 alternately on the right and left among the neighboring ceramic layers 11.

Then, as shown in FIG. 12, the dewaxing step S17 is conducted to heat and remove not less than 90% of the binder resin contained in the ceramic layers 11 of the ceramic laminate 1. Concretely speaking, the ceramic laminate 1 is heated in an atmosphere at a temperature of 350° C. for 5 hours to remove the binder resin.

Then, as shown in FIG. 12, the sintering step S18 is conducted to fire the ceramic laminate 1 after the dewaxing. In this Example, the sintering is conducted under the conditions of a temperature of 1100° C. for 2 hours.

Figure 18:
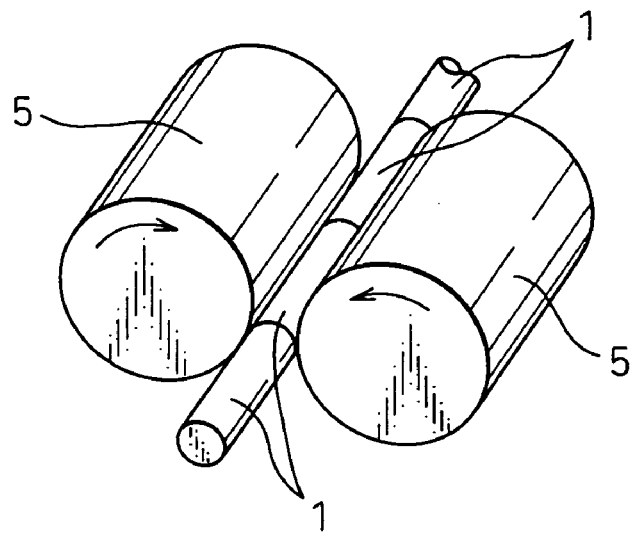
FIG. 18 is a view illustrating a state of conducting the centerless grinding in the step of grinding the side surfaces according to Example 3.

In this Example as shown in FIGS. 12 and 18, further, the step S19 is conducted to grind the side surfaces.

Referring to FIG. 18, centerless grinding is effected by using a pair of drum-shaped grind stones 5. Concretely speaking, the cylindrical ceramic laminate 1 is positioned between the grind stones 5 that are revolving and is continuously and gradually moved in the axial direction without being fixed. Accordingly, the ceramic laminate 1 is uniformly polished along its side surfaces.

Figure 19:
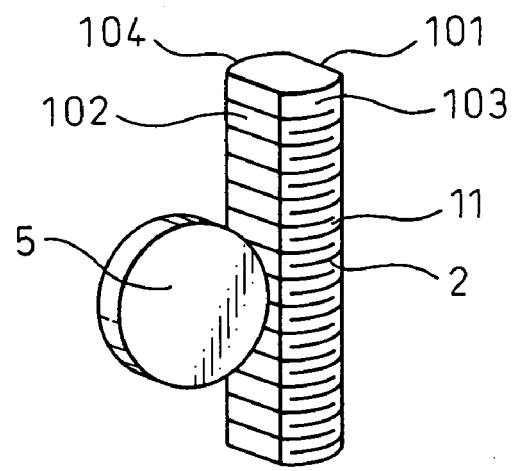
FIG. 19 is a view illustrating a state of forming side flat portions in the step of grinding the side surfaces according to Example 3.
Figure 20:
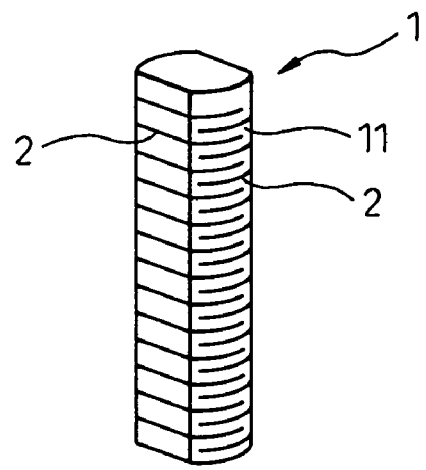
FIG. 20 is a perspective illustrating the ceramic laminate of a barrel shape in cross section according to Example 3.

Referring next to FIG. 19, the two opposing surfaces having blank portions 12 are ground flat to form side flat portions 101 and 102. Other side surfaces 103 and 104 remain in an arcuate shape. Thus, there is obtained, as shown in FIG. 20, the ceramic laminate 1 having a barrel shape in cross section.

Next, described below are the action and effect of this Example.

In this Example, the primary press-adhering step S14 forms the pre-laminate 11 which is, then, cut into a plurality of unit bodies 115 through the unit-cutting step S15. Here, the unit body is punched to assume a circular outer circumferential shape.

Accordingly, the punching stress does not concentrate during the punching at the unit-cutting step S15. In the unit body 115 that is cut, therefore, the internal electrode layer 2 is not greatly deformed. Even after the dewaxing step S17 and the sintering step S18 are conducted, therefore, the internal electrode layer 2 does not deform, and the delamination and cracks do not occur.

The unit-cutting step S15 cuts the pre-laminate 11 which is formed by laminating a plurality of ceramic sheets 110. Therefore, the unit body 115 is handled in a unit of a number of the laminated layers of the pre-laminate 11, and the production efficiency does not decrease unlike that of when the ceramic layers 11 are handled piece by piece.

In this Example, further, the cylindrical ceramic laminate 1 is subjected to the centerless grinding at the start of the grinding step as described above. Accordingly, a plurality of ceramic laminates 1 can be continuously ground (polished). This step is not effected when the ceramic laminate has a square cylindrical shape. In this respect, too, the production efficiency can be increased as compared to when the unit body of a square shape is used.

In this Example as described above, the unit-cutting step S15 punches the pre-laminate 11 into a cylindrical shape, and the excess portions turn into scraps. However, the scraps have not yet been put to the dewaxing step and can be reused as a starting material for the ceramic sheet, contributing to improving the yield of the material.

In this Example, further, the thickness of the internal electrode layer 2 is set to be 1/40 the thickness of the ceramic layer 11 as described earlier. Therefore, the occurrence of the delamination and cracks is hardly caused by the presence of the internal electrode layer 2, and a sufficient degree of electric characteristics is maintained.

The ceramic laminate 1 of this Example uses piezo-electric ceramics as the ceramic layer 11, and can be used as a piezo-electric actuator. Besides, the ceramic laminate 1 suppresses the occurrence of delamination and cracks. Therefore, the ceramic laminate 1 exhibits excellent durability when it is incorporated in an injector that is used under very severe conditions.

EXAMPLE 4

This Example deals with another punching method that can be applied to the unit-cutting step S15 of Example 3.

Figure 21:
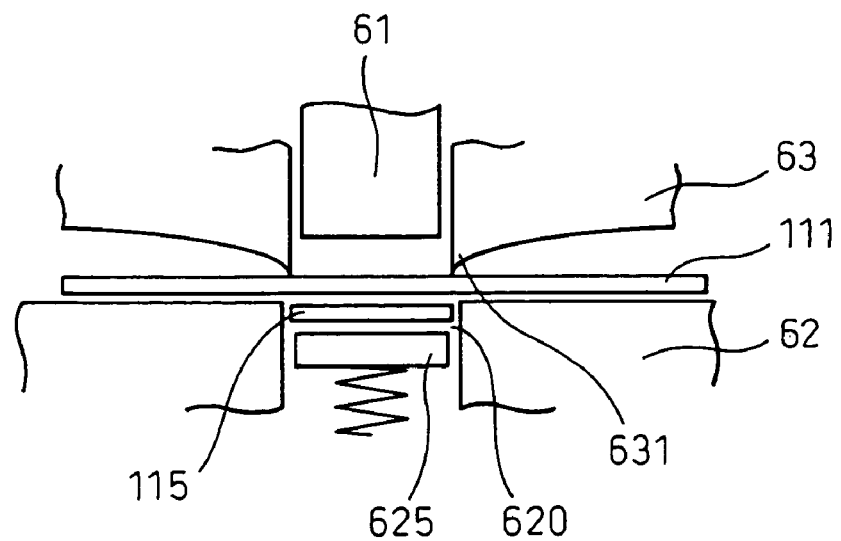
FIG. 21 is a view illustrating a device used for the unit-cutting step according to Example 4.

In this Example as shown in FIG. 21, use is made of a device having a punch 61, a die 62, as well as a stripper 63 which is arranged to retractably protrude separately from the punch 61. The punch 61 has a cylindrical end. The die 62 has a punching hole 620 in which the punch 61 can be inserted maintaining a predetermined clearance. The stripper 63 has a protuberance 631 formed at an end thereof.

In this Example, further, the punching hole 620 of the die 62 is provided with a receiving plate 625 for receiving the unit body 115 that is punched. The receiving plate 625 has a suction port in the surface thereof. A negative pressure is established in the suction port to absorb the unit body 115 that is punched.

To conduct the unit-cutting step S15 by using this device, the stripper 63 is, first, forwarded to the pre-laminate 111 that is placed on the die 62, so that the protrusion 631 is stabbed half into the thickness of the pre-laminate 111 to form a slot therein. Then, the punch 61 is forwarded to punch the pre-laminate thereby to form a disk-like unit body 115.

Thus, the slot is formed by the protuberance 631 before effecting the shearing by using the punch 61 and the die 62, so that the shearing is smoothly conducted by the punch 61 and by the die 62. This makes it possible to further suppress the deformation of the ceramic layers 11 and of the internal electrode layers 2 caused by the shearing stress.

In this Example which is provided with the receiving plate 625, further, the unit bodies 115 are successively laminated on the receiving plate 625 as the pre-laminate 111 is moved so as to be successively cut into the unit bodies 115. Therefore, the unit bodies 115 that are obtained can be handled batchwise in a state of being laminated in a plural number to improve the production efficiency.

The action and effect in other respects are the same as those of Example 3.

EXAMPLE 5

This Example deals with a further punching method that can be applied to the unit-cutting step S15 of Example 3.

Figure 22:
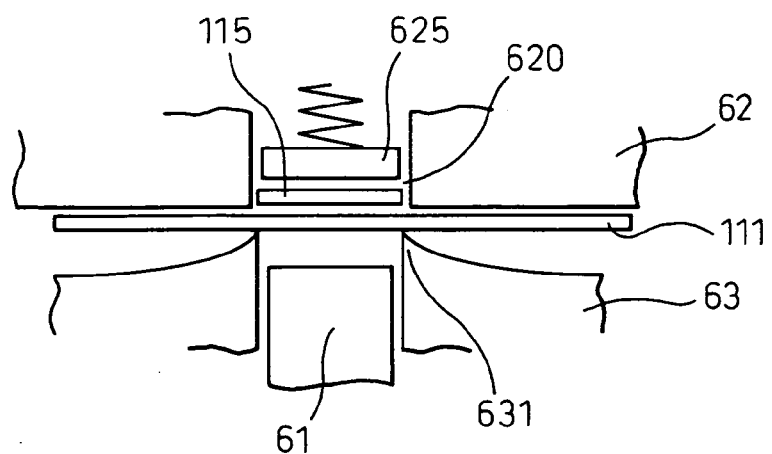
FIG. 22 is a view illustrating a device used for the unit-cutting step according to Example 5.

Referring to FIG. 22, the device used in this Example has an up-and-down relationship which is opposed to that of the case of Example 4.

Namely, in this Example, a die 62 and a receiving plate 625 are arranged on the upper side, and a punch 61 and a stripper 63 are arranged on the lower side.

The stripper 63 has a protuberance 631 formed at an end thereof.

In this Example, further, the punching hole 620 of the die 62 is provided with the receiving plate 625 for receiving the unit body 115 that is punched. The receiving plate 625 has a suction port in the surface thereof. A negative pressure is established in the suction port to absorb the unit body 115 that is punched.

To conduct the unit-cutting step S15 by using this device, the pre-laminate 111 placed on the stripper 63 is raised together with the stripper 63, and is brought into contact with the die 62. The stripper 63 is further forwarded, so that the protuberance 631 is stabbed half into the thickness of the pre-laminate 111 to form a slot therein. Then, the punch 61 is forwarded (raised) to punch the pre-laminate 111 thereby to form a disk-like unit body 115.

In this Example, which is provided with the receiving plate 625, further, the unit body 115 that is punched is sucked and held by the receiving plate 625. The second and subsequent unit bodies 115 that are punched are successively and temporarily press-adhered to the unit bodies 115 that have been punched already due to the pressing force at the time of punching. Therefore, the unit bodies 115 that are punched are all held by the adsorbing force. Accordingly, the subsequent unit bodies 115 can be further easily handled.

The action and effect in other respects are the same as those of Examples 1 and 2.

EXAMPLE 6

In this Example, the pre-laminate is punched by the unit-cutting step S15 of Example 3 in a manner that the outer circumference assumes a smoothly curved shape, in order to quantitatively find the effect for decreasing the warping. Concretely speaking, an experiment is conducted to compare the unit body 115 that is punched in a circular shape as a representative example of when the unit body has a smoothly curved outer circumference with the unit that is punched in a square shape.

The following four kinds of punching methods are employed.

A first method uses the punch 61 and the die 62 only as shown in FIG. 14 like in Example 3.

A second method uses, as shown in FIG. 21, a device which includes the stripper 63 surrounding the punch 61, the stripper 63 being provided with the protuberance 631 like the one as described above but without having receiving plate 62 like in Example 4.

A third method uses a device having a protuberance (not shown) surrounding the punching hole 620 of the die 62 of Example 3, the protuberance protruding toward the punch.

A fourth method is quite the same as that of Example 4, but the device of the second method being provided with the receiving plate 64.

In any one of these methods, the shapes of the punch and of the punching hole are changed into a circular shape or a rectangular shape as desired.

Figure 23:
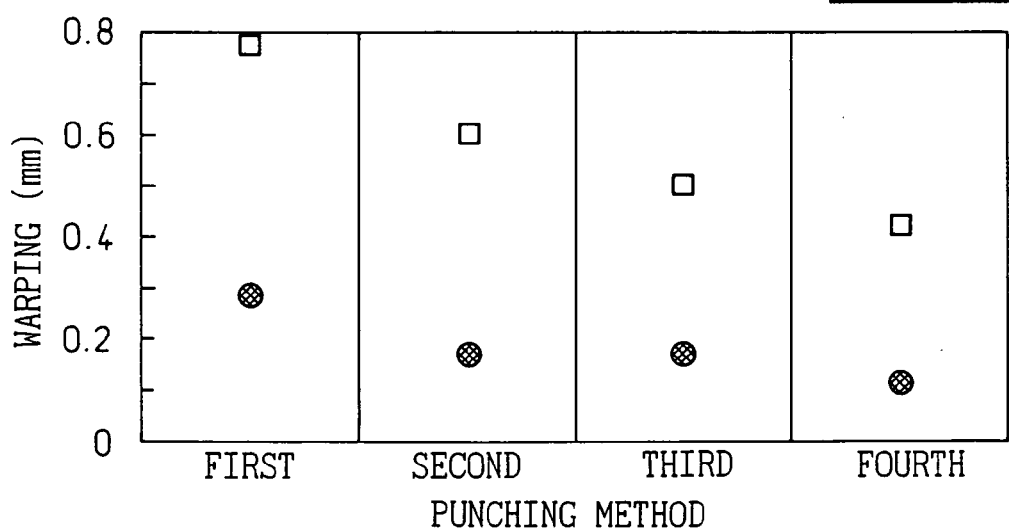
FIG. 23 is a diagram illustrating a relationship between the punching method and the amount of warping according to Example 6.
Figure 24A:
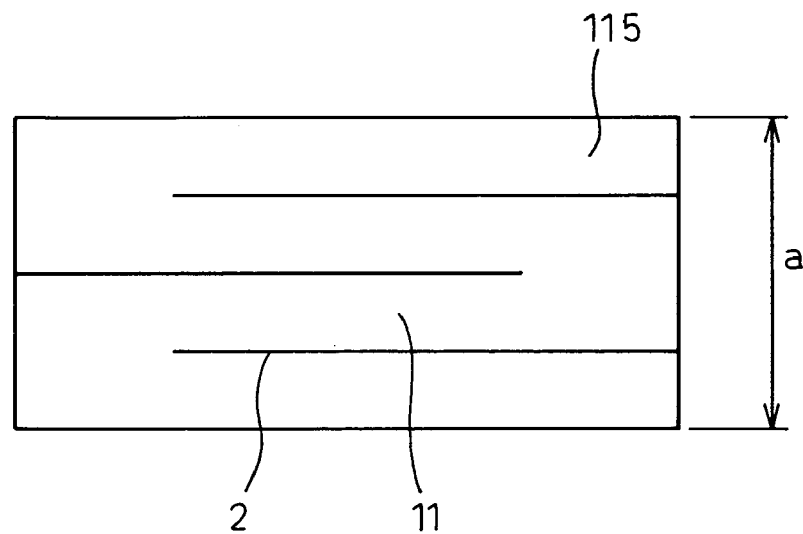
FIGS. 24(a) and 24(b) are diagrams illustrating the definition of the amount of warping.
Figure 24B:
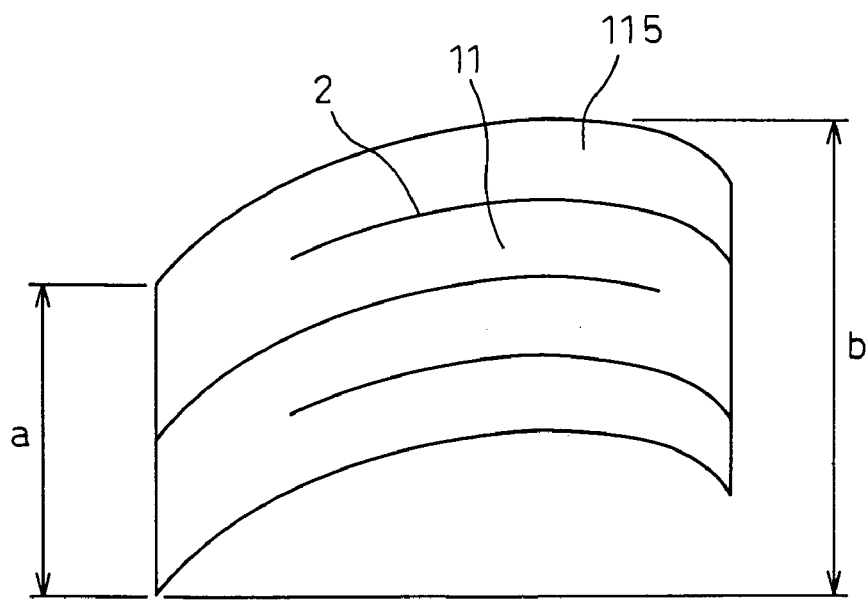

FIG. 23 shows the results of the experiment wherein the abscissa represents the punching methods and the ordinate represents the warping (mm) measured after cutting. As shown in FIGS. 24(a) and 24(b), the warping amount is found from b–a (mm), a representing a height of when there is no warping (FIG. 24(a)) and b representing a maximum height in a warped state (FIG. 24(b)).

FIGS. 24(a) and 24(b) show that the warping is smaller when the pre-laminate is punched in a smoothly curved circular shape without corners than when the pre-laminate is punched in a square shape having corners no matter which punching method is employed. It is further learned that the warping is more improved when there is employed a stripper having a protuberance, when a protuberance is arranged on the die, or when the receiving plate is arranged than when the punch and the die are simply combined together.

EXAMPLE 7

In this Example, a correlation is found among the temperature, warping and defective delamination of the pre-laminate 111 in the unit-cutting step S15 of Example 3.

Concretely speaking, the unit bodies are produced by the same cutting method as that of Example 3 but changing the temperature only of the pre-laminate 111. The warping amounts are measured. Further ceramic laminates 1 of final shapes are produced by using the unit bodies in the same manner as in Example 3 to examine the rate of occurrence of defective delamination.

Figure 25:
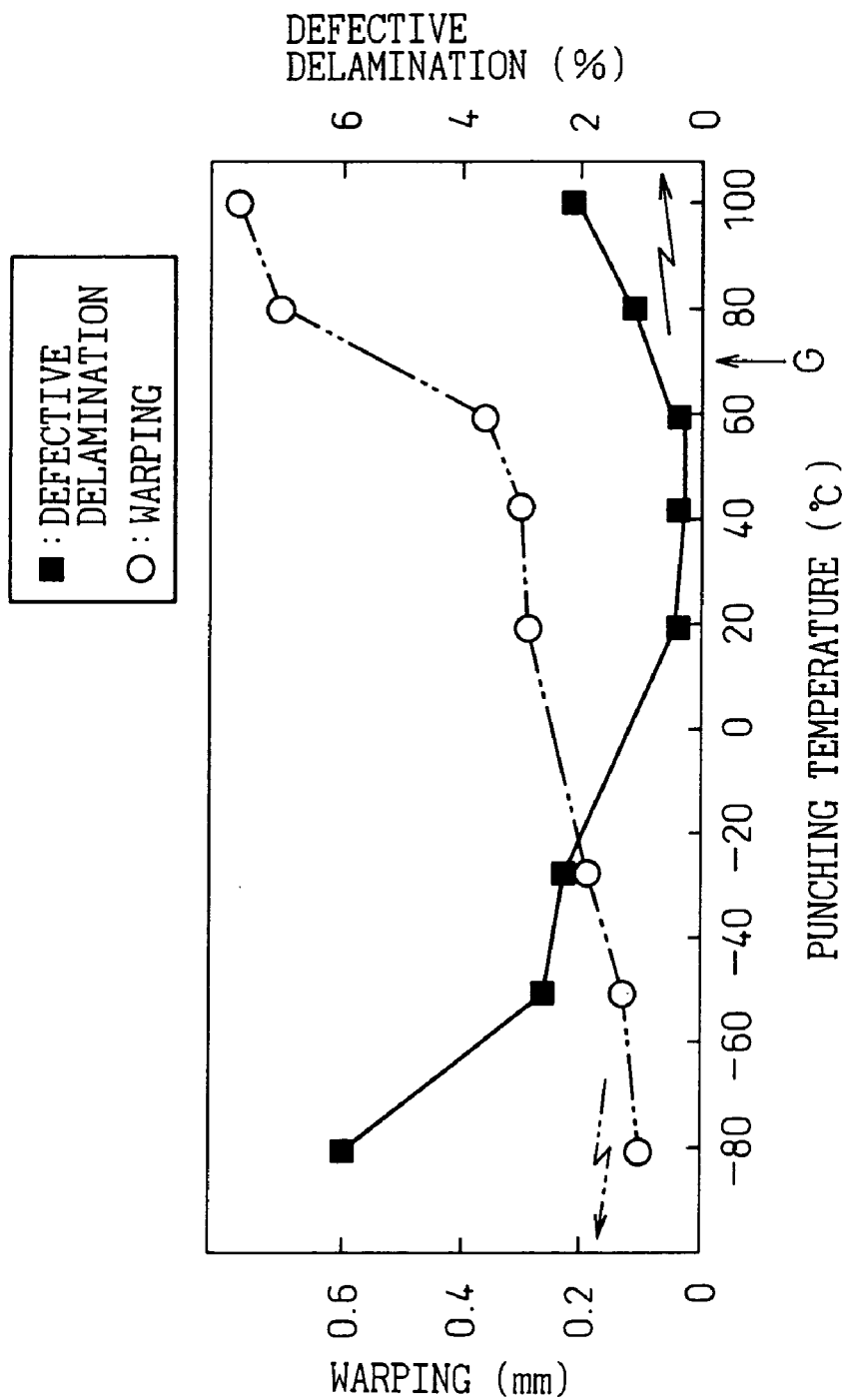
FIG. 25 is a diagram illustrating relationships among the punching temperature, defective delamination and amount of warping according to Example 7.

The results are as shown in FIG. 25 wherein the abscissa represents the punching temperature (temperature of the pre-laminate), the left ordinate represents the warping (mm) and the right ordinate represents the defective delamination (%).

As will be learned from FIG. 25, the warping is improved as the punching temperature decreases, but the defective delamination increases as the temperature becomes too low or too high. From the results of this Example, the delamination conspicuously increases as the temperature becomes lower than −70° C. and gradually increases as the temperature becomes higher than the glass transition point "G" of the binder resin in the ceramic layers. It is therefore learned that the punching be effected by the unit-cutting step S15 at a temperature at least within a range of from −70° C. to "G"° C.

Figure 26:
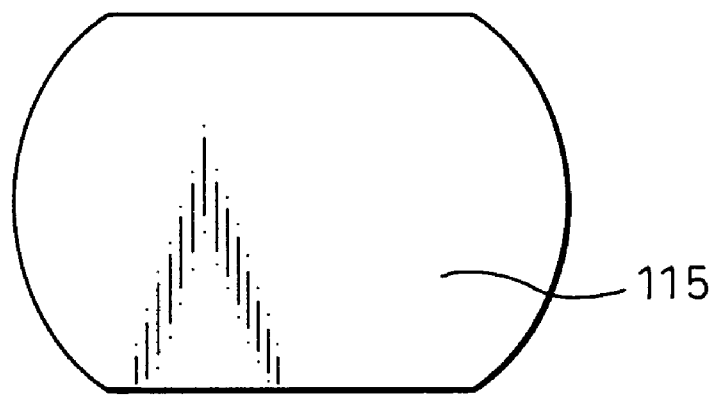
FIG. 26 is a view of when the unit body is punched in the shape of a barrel.
Figure 27:
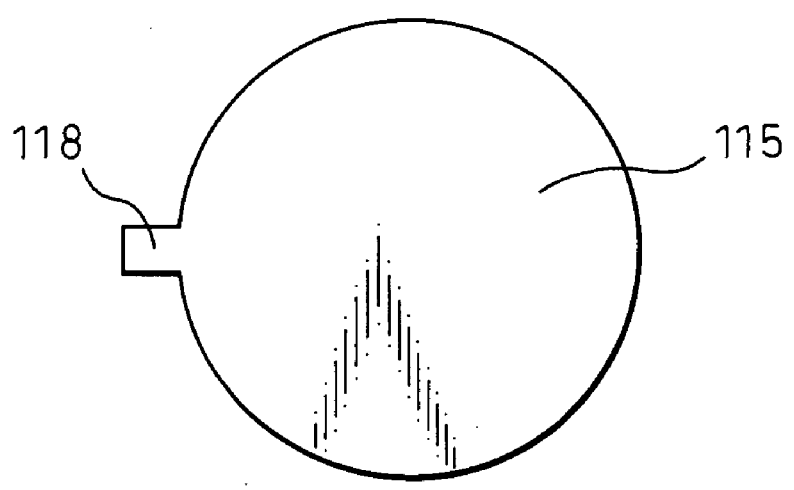
FIG. 27 is a view of when the unit body is punched in substantially a circular shape.

In the above-mentioned Examples, the unit body is punched in a circular shape. The present invention, however, is not limited to the circular shape only, but may be punched into a barrel shape as shown in FIG. 26 or into a substantially circular shape having a projection 118 but the rest of the portion being nearly a circular shape as shown in FIG. 27.

Further, the unit body 115 may be of an octagonal shape as will be described later. Upon providing the projection 118, the laminate is suppressed from revolving about the axis of the laminate at the time of press-adhesion. Therefore, the products of homogeneous quality can be obtained.

EXAMPLE 8

Figure 28:
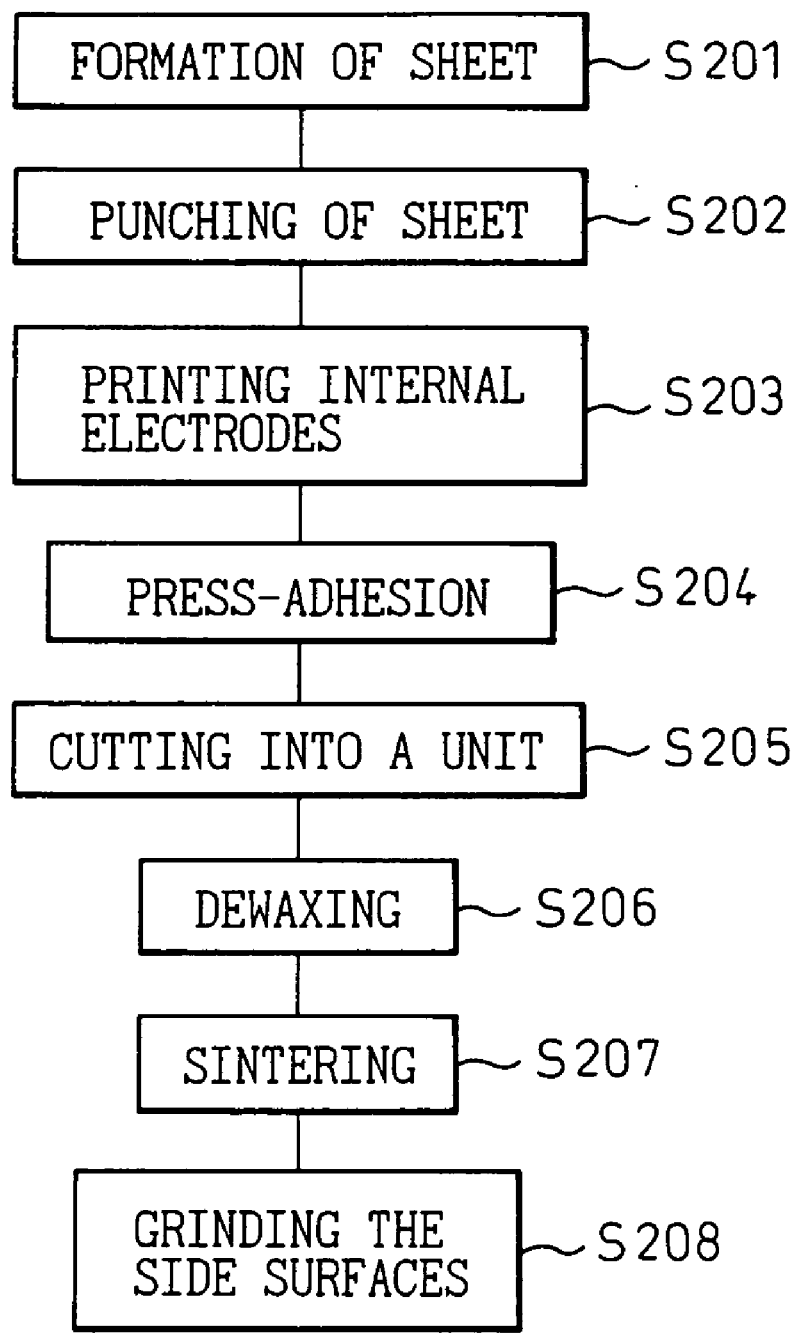
FIG. 28 is a diagram illustrating the steps of production according to Example 8.

As shown in FIGS. 28 and 29, this Example is to produce a ceramic laminate 1 with a single unit body 115.

In this method of production as shown in FIG. 28, there are conducted a sheet-forming step S201, a sheet-punching step S202 and an internal electrode-printing step S203 like in Example 1. Then, a press-adhering step S204 is conducted as shown in FIGS. 28 and 29(*a*) to 29(*c*).

The conditions of the press-adhering step S204 are such that the heating temperature is 120° C., the pressing pressure is 15 MPa and the holding time is 3 minutes. Next, the unit-cutting step S205 is conducted to cut the unit body 115 from the pre-laminate 111 that is obtained.

In this Example as shown in FIG. 29(*d*), an octagonal unit body 115 is obtained (with the four corners of a square cut away). That is, this Example employs a unit body that is cut into a polygonal shape of which the inner angles are all not smaller than 90°.

In this Example, next, there are conducted the dewaxing step S206 and the sintering step S207 under the same conditions as those in Example 3.

Thereafter, the side grinding step S208 is conducted. The side grinding step S208 is so conducted that the overall shape acquires an octagonal column shape.

In this Example as described above, the ceramic laminate 1 is produced by using a single unit body 115. In this case, too, there are exhibited the same action and effect as those of Example 1.

That is, in this Example, the pre-laminate is punched by the unit-cutting step S205 into an octagonal shape of which the inner angles are all not smaller than 90°. Therefore, the punching stress is not almost concentrated during the punching by the unit-cutting step S205. Accordingly, the internal electrode layer 2 is not greatly deformed in the unit body 115 that is cut. Even after the dewaxing step S207 and the sintering step S208 are conducted, therefore, the internal electrode layers 2 are not deformed and the occurrence of delamination and cracks is suppressed.

The action and effect are the same as those of Example 1.

EXAMPLE 9

Figure 31:
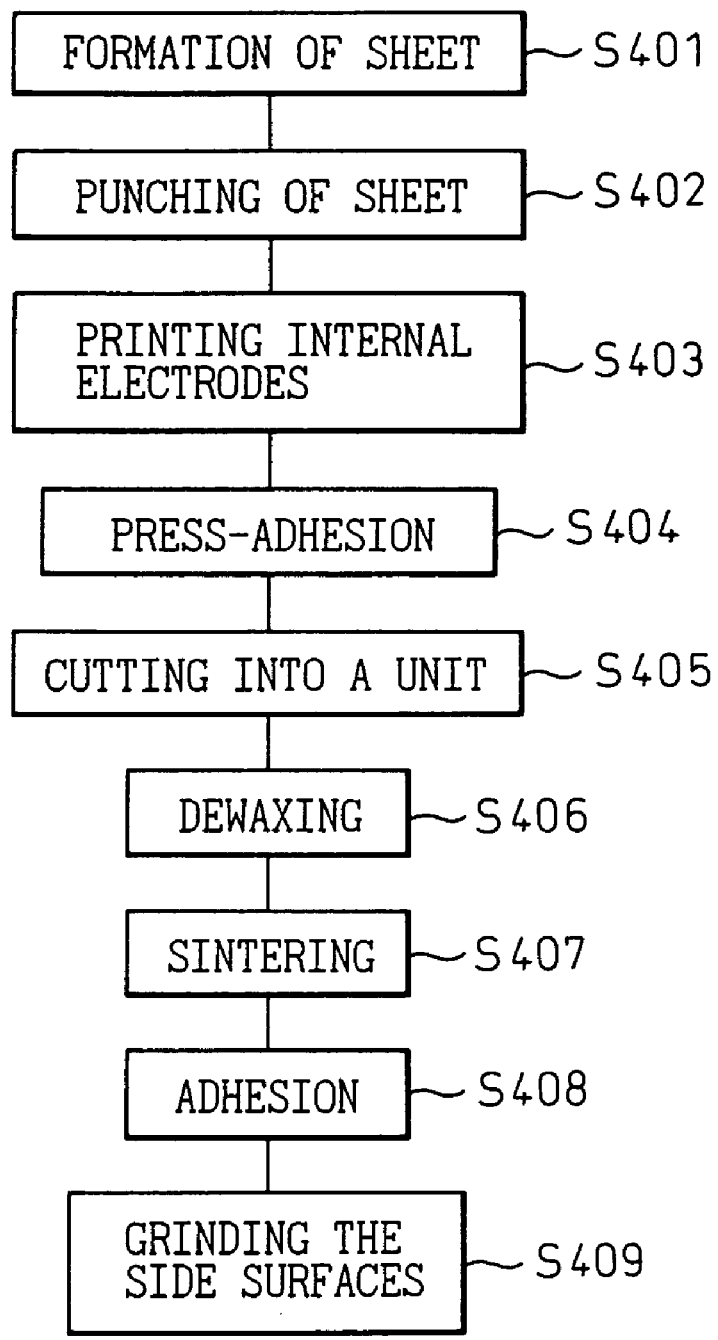
FIG. 31 is a diagram illustrating the steps of production according to Example 9.
Figure 32:
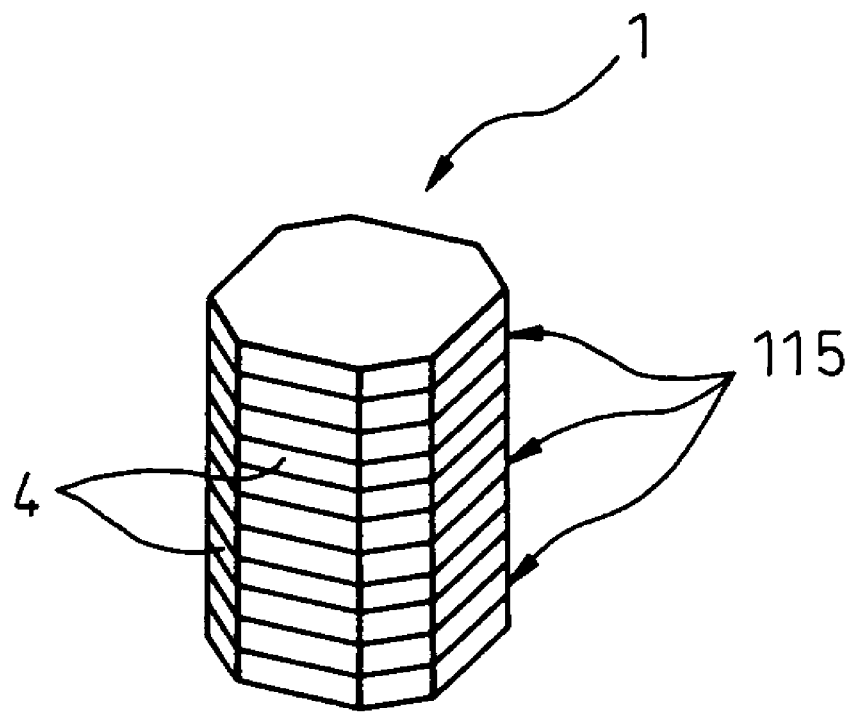
FIG. 32 is a perspective view of the ceramic laminate according to Example 9.

As shown in FIGS. 31 and 32, this Example is to produce a ceramic laminate 1 having the same shape as that of Example 8 but having a large size in the direction of lamination.

In this Example as shown in FIG. 31, there are conducted a sheet-forming step S401, a sheet-punching step S402, an internal electrode-printing step S403, a press-adhering step S404, a unit-cutting step 5405, a dewaxing step S406 and a sintering step 5407 like in Example 8 to obtain a plurality of unit bodies 115 that have been sintered.

Then, as shown in FIGS. 31 and 32, the unit bodies 115 are laminated via adhesive layers 4 (adhering step S408). There is thus obtained a ceramic laminate having a large size in the direction of lamination.

In this Example, too, the side-grinding step S409 is finally conducted.

The side-grinding step S409 may be conducted prior to the adhering step S408.

In this case, too, there are obtained an action and an effect which are the same as those of Example 8.

EXAMPLE 10

Figure 33:
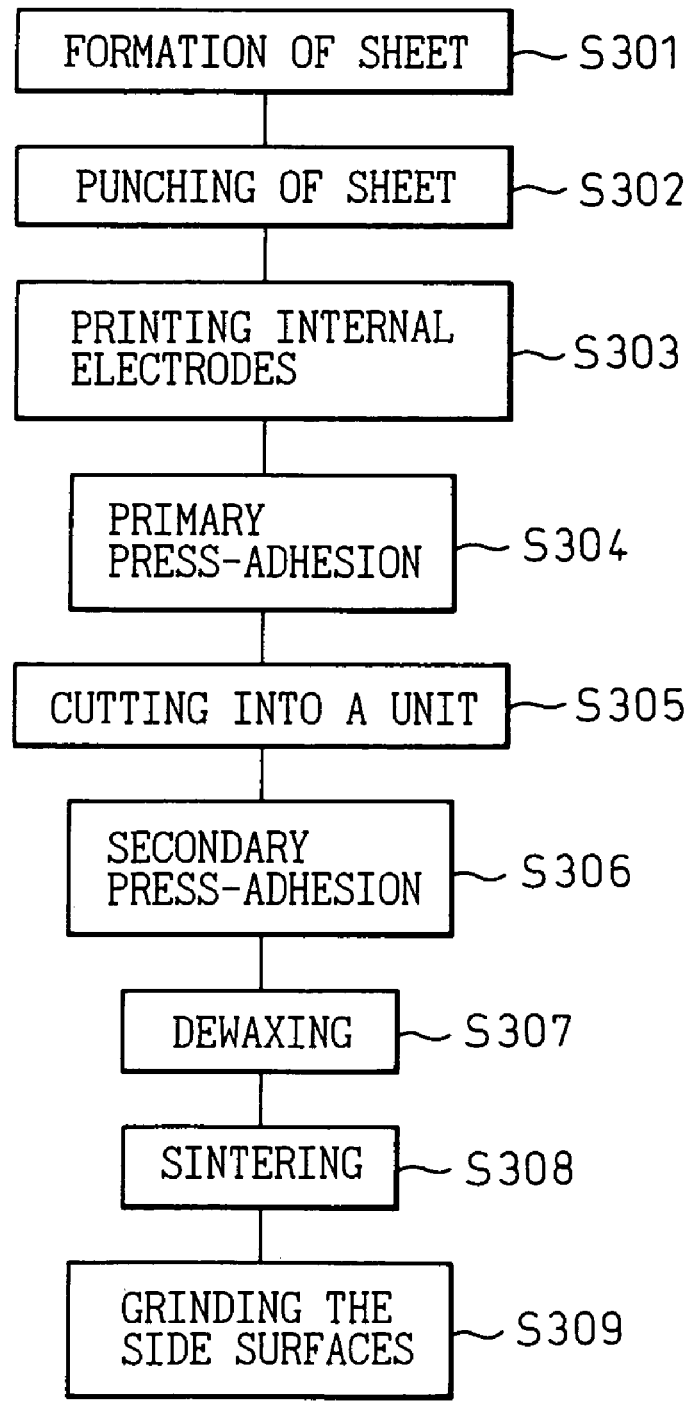
FIG. 33 is a diagram illustrating the steps of production according to Example 10.
Figure 34A:
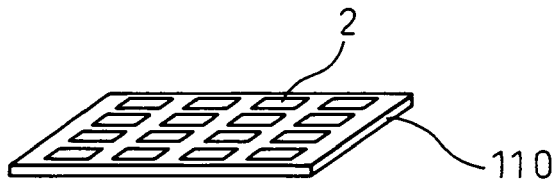
FIGS. 34(a) to 34(f) are views illustrating the steps of production according to Example 10.
Figure 34B:
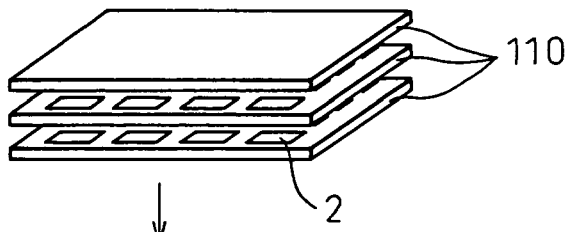
Figure 34C:
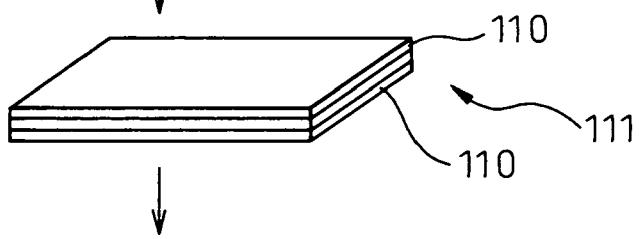
Figure 34D:
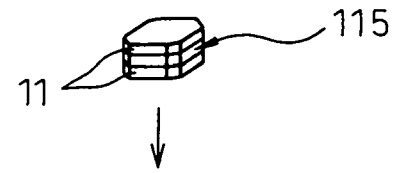
Figure 34E:
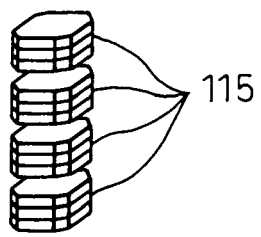
Figure 34F:
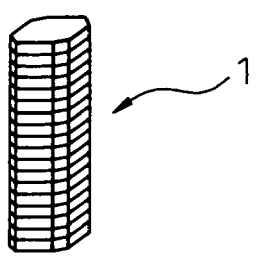

In this Example, as shown in FIGS. 33 and 34(*a*) to 34(*f*), a secondary press-adhering step S306 like that of Example 1 is added to the production step of Example 8 in order to increase the size of the ceramic laminate in the direction of lamination, the ceramic laminate having the same shape as that of Example 8.

That is, in this Example as shown in FIG. 33, there are conducted a sheet-forming step S301, a sheet-punching step S302, an internal electrode-printing step S303, a primary press-adhering step S304 and a unit-cutting step S305 like in Example 3. The unit-cutting step S305 cuts an octagonal shape like that in Example 8.

Then, as shown in FIGS. 34(*d*) to 34(*f*), the secondary press-adhering step S306 is conducted. The conditions here are the same as those in Example 3.

Figure 35:
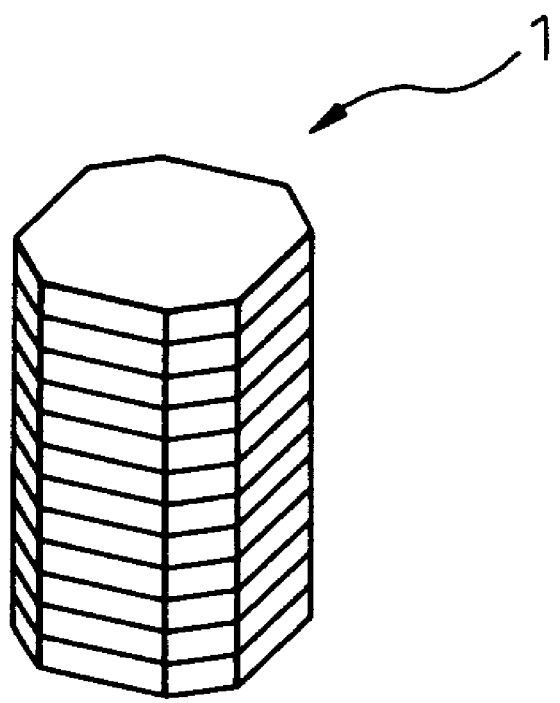
FIG. 35 is a perspective view illustrating the ceramic laminate according to Example 10.

Thereafter, the dewaxing step S307, sintering step S308 and side-grinding step S309 are conducted to obtain a ceramic laminate 1 which is laminated to become tall as shown in FIG. 35.

In this case, too, there are obtained an action and an effect which are the same as those of Examples 3 and 8.

In this Example, a ceramic laminate is obtained having a height of lamination at the time of the secondary press-adhesion. It is further allowable to stack the ceramic laminates via adhesive layers, as in Example 9, to obtain a ceramic laminate having a further increased height of lamination.

EXAMPLE 11

FIG. 36 shows shapes of internal electrode layers 2 that can be employed for the ceramic laminates of Examples 8 to 11.

In this Example as shown in FIGS. 36(*a*) and 36(*b*), the internal electrode layers of two kinds of shapes are alternately arranged.

The internal electrode layers 2 have blank portions 151, 152, respectively. Referring to FIG. 36(*a*), one blank portion 151 is of a shape covering the outer sides of one long side and the neighboring two short sides of nearly an octagon consisting of four long sides and four short sides which are alternately connected. Referring to FIG. 36(*b*), the other blank portion 152 is provided along the outer peripheral sides of seven sides except one long side.

In the laminated state, the regions 252 of the internal electrode layers contacting to the sides H1 to H5 in FIG. 36(*c*) and the regions 252 of the internal electrode layers contacting to the side H7, alternately exist. Namely, the internal electrode layers 2 necessarily exist in the octagonal regions 250. In arranging a pair of side electrodes, therefore, one side electrode can be arranged to come in contact with any place of the region 251 and the other side electrode can beaa arranged at a place to come in contact with the region 252.

The shapes of the internal electrodes 2 are only some of the examples, and can be changed into any other shapes.

What is claimed is:

1. A method of producing a ceramic laminate by laminating a plurality of pieces of ceramic layers, said method comprising:

a temporarily press-adhering step of laminating wide ceramic sheets including a plurality of ceramic layers in the direction of width in a number of pieces smaller than a final number of the laminated layers, followed by heating and pressing in the direction of lamination to form a pre-laminate;

a unit-cutting step of forming a unit body having a width that includes a piece of ceramic layer in the direction of width and having a number of layers smaller than the final number of the laminated layers by cutting said pre-laminate into a plurality of pieces in the direction of width;

a main press-adhering step of laminating a plurality of said unit bodies so that said ceramic layers are laminated in the final number of the laminated layers, and heating and pressing said unit bodies in the direction of lamination to obtain said ceramic laminate;

a dewaxing step of heating and removing not less than 90% of a binder resin contained in said ceramic layers of said ceramic laminate after said main press-adhering step has been finished; and a sintering step of sintering said ceramic laminate;

wherein the heating temperature in said temporarily press-adhering step is lower than the heating temperature in said main press-adhering step, and wherein the heating temperature in said main press-adhering step is higher than the heating temperature in said temporarily press-adhering step by more than 20 degrees Celsius but is lower than the thermal decomposition temperature of said binder resin.

2. A method of producing a ceramic laminate by laminating a plurality of pieces of ceramic layers, comprising:

a first temporarily press-adhering step of laminating wide ceramic sheets including a plurality of ceramic layers in the direction of width in a number of pieces smaller than a final number of the laminated layers, followed by heating and pressing in the direction of lamination to form a pre-laminate;

a second temporarily press-adhering step of cutting said pre-laminate into a plurality of pieces in the direction of width, laminating a plurality of the pre-laminates that have been cut, heating and pressing the pre-laminates in the direction of lamination to form a new pre-laminate;

a unit-cutting step of forming a unit body having a width that includes a piece of ceramic layer in the direction of width and having a number of layers smaller than the final number of the laminated layers by cutting the pre-laminate obtained by conducting said second temporarily press-adhering step one time or a plurality of number of times into a plurality of pieces in the direction of width;

a main press-adhering step of laminating a plurality of said unit bodies so that said ceramic layers are laminated in the final number of the laminated layers, and heating and pressing said unit bodies in the direction of lamination to obtain said ceramic laminate;

a dewaxing step of heating and removing not less than 90% of a binder resin contained in said ceramic layers of said ceramic laminate after said main press-adhering step has been finished; and a sintering step of sintering said ceramic laminate.

3. A method of producing a ceramic laminate according to claim 2, wherein an aspect ratio which is a ratio of the size of said ceramic laminate in the direction of lamination to the size thereof in the direction of width at right angles thereof, is not smaller than 1.

4. A method of producing a ceramic laminate according to claim 2, wherein the heating temperature in said temporarily press-adhering step is lower than, or equal to, the heating temperature in said main press-adhering step.

5. A method of producing a ceramic laminate according to claim 2, wherein the pressing force in said temporarily press-adhering step is lower than, or equal to, the pressing force in said main press-adhering step.

6. A method of producing a ceramic laminate according to claim 2, wherein the heating temperature in said temporarily press-adhering step is not lower than the glass transition point of the binder resin contained in said ceramic layers.

7. A method of producing a ceramic laminate according to claim 2, wherein the heating temperature in said main press-adhering step is higher than the heating temperature in said temporarily press-adhering step by more than 20 degrees but is lower than the thermal decomposition temperature of said binder resin.

8. A method of producing a ceramic laminate according to claim 2, wherein the pressing force is applied in said temporarily press-adhering step from the direction of lamination only and is applied in said main press-adhering step from the direction of lamination while holding the laminate from the side direction at right angles with the direction of lamination.

9. A method of producing a ceramic laminate according to claim 2, wherein said ceramic layers comprise piezo-electric ceramics, and said ceramic laminate is the one for a piezo-actuator constituted by alternately laminating said ceramic layers and internal electrode layers.

10. A method of producing a ceramic laminate by laminating a plurality of pieces of ceramic layers, comprising:

a first temporarily press-adhering step of laminating wide ceramic sheets including a plurality of ceramic layers in the direction of width in a number of pieces smaller than a final number of the laminated layers, followed by heating and pressing in the direction of lamination to form a pre-laminate;

a unit-cutting step of forming a unit body having a width that includes a piece of ceramic layer in the direction of width and having a number of layers smaller than the final number of the laminated layers by cutting said pre-laminate into a plurality of pieces in the direction of width;

a second temporarily press-adhering step of forming a new unit body having a number of layers smaller than the final number of the laminated layers by repeating one or a plurality of number of times the procedure for forming a new unit body by laminating a plurality of said unit bodies produced in said unit-cutting step, followed by heating and pressing in the direction of lamination;

a main press-adhering step of laminating a plurality of said new unit bodies so that said ceramic layers are laminated in the final number of the laminated layers, and heating and pressing said new unit bodies in the direction of lamination to obtain said ceramic laminate;

a dewaxing step of heating and removing not less than 90% of a binder resin contained in said ceramic layers of said ceramic laminate after said main press-adhering step has been finished; and a sintering step of sintering said ceramic laminate.

11. A method of producing a ceramic laminate by alternately laminating ceramic layers and internal electrode layers, said method comprising:

a press-adhering step of forming a pre-laminate by laminating wide ceramic sheets including a plurality of ceramic layers in the direction of width, and heating and pressing them in the direction of lamination;

a unit-cutting step of forming a unit body having a width that include a piece of ceramic layer in the direction of width by so punching said pre-laminate as to assume a polygonal convex outer circumferential shape of which the inner angles are all not smaller than 90° or to assume a smoothly curved convex outer circumferential shape;

a dewaxing step of heating and removing not less than 90% of a binder resin contained in said ceramic layers of said unit body; and a sintering step of sintering said unit body;

wherein said unit cutting step executes the punching in substantially a barrel shape or a polygonal outer circumferential shape having inner angles of at least 90°, wherein the thickness of said internal electrode layer is in a range of from $1/100$ to $1/10$ the thickness of said ceramic layer, and wherein when the glass transition point of the resin component contained in said ceramic layers is denoted by G (° C.), said unit-cutting step is conducted in a range of from −70 (° C.) to G (° C.).

12. A method of producing a ceramic laminate by alternately laminating ceramic layers and internal electrode layers, said method comprising:

a press-adhering step of forming a pre-laminate by laminating wide ceramic sheets including a plurality of ceramic layers in the direction of width, and heating and pressing them in the direction of lamination;

a unit-cutting step of forming a unit body having a width that include a piece of ceramic layer in the direction of width by so punching said pre-laminate as to assume a polygonal convex outer circumferential shape of which the inner angles are all not smaller than 90° or to assume a smoothly curved convex outer circumferential shape;

a dewaxing step of heating and removing not less than 90% of a binder resin contained in said ceramic layers of said unit body; and a sintering step of sintering said unit body;

wherein said unit cutting step executes the punching in substantially a circular shape, a barrel shape or a polygonal outer circumferential shape having inner angles of at least 90°, wherein the thickness of said internal electrode layer is in a range of from $1/100$ to $1/10$ the thickness of said ceramic layer, and wherein said unit-cutting step is conducted by using a punch having an end of a desired shape and by using a die having a punching hole in which said punch can be inserted maintaining a predetermined clearance, and at least either said punch or said die further has a protuberance for forming a slot in said pre-laminate.

13. A method of producing a ceramic laminate according to claim 12, wherein said punching hole of said die is provided with a receiving plate for receiving said unit bodies that are punched, and said unit bodies produced by the punching step that is continuously conducted are successively laminated on said receiving plate.

14. A method of producing a ceramic laminate according to claim 13, wherein said unit bodies are successively laminated on said receiving plate and are successively press-adhered.

15. A method of producing a ceramic laminate by alternately laminating ceramic layers and internal electrode layers, said method comprising:

a press-adhering step of forming a pre-laminate by laminating wide ceramic sheets including a plurality of ceramic layers in the direction of width, and heating and pressing them in the direction of lamination;

a unit-cutting step of forming a unit body having a width that include a piece of ceramic layer in the direction of width by so punching said pre-laminate as to assume a polygonal outer circumferential shape of which the inner angles are all not smaller than 90° or to assume a smoothly curved outer circumferential shape;

a dewaxing step of heating and removing not less than 90% of a binder resin contained in said ceramic layers of said unit body; and a sintering step of sintering said unit body;

wherein said unit cutting step executes the punching in substantially a circular shape, a barrel shape or a polygonal outer circumferential shape having inner angles of at least 90°, wherein said punching step is conducted by using a punch having an end of a desired shape, a die having a punching hole in which said punch can be inserted maintaining a predetermined clearance, and a stripper disposed surrounding said punch to be retractably protruded separately from said punch and having a protuberance at an end thereof, and wherein said stripper is forwarded to said pre-laminate placed on said die until said protuberance is stabbed into half the thickness of said pre-laminate to thereby form a slot and, then, said punch is forwarded to punch said pre-laminate thereby to form said unit body.

16. A method of producing a ceramic laminate according to claim 15, wherein said punching hole of said die is provided with a receiving plate for receiving said unit bodies that are punched, and said unit bodies produced by the punching step that is continuously conducted are successively laminated on said receiving plate.

17. A method of producing a ceramic laminate according to claim 16, wherein said unit bodies are successively laminated on said receiving plate and are successively press-adhered.

\* \* \* \* \*